United States Patent
Kim et al.

(10) Patent No.: US 11,914,778 B2
(45) Date of Patent: Feb. 27, 2024

(54) DISPLAY APPARATUS

(71) Applicant: LG Display Co., Ltd., Seoul (KR)

(72) Inventors: SeYoung Kim, Paju-si (KR); Sungsu Ham, Paju-si (KR); Joongsup Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 289 days.

(21) Appl. No.: 17/094,230

(22) Filed: Nov. 10, 2020

(65) Prior Publication Data
US 2021/0157410 A1    May 27, 2021

(30) Foreign Application Priority Data

Nov. 27, 2019  (KR) .......................... 10-2019-0154859

(51) Int. Cl.
| | | |
|---|---|---|
| *G06F 3/01* | (2006.01) | |
| *G02F 1/1333* | (2006.01) | |
| *H04R 9/02* | (2006.01) | |
| *H04R 9/04* | (2006.01) | |
| *H04R 1/02* | (2006.01) | |
| *H10K 50/87* | (2023.01) | |

(52) U.S. Cl.
CPC ........ *G06F 3/016* (2013.01); *G02F 1/133382* (2013.01); *H04R 1/028* (2013.01); *H04R 9/025* (2013.01); *H04R 9/04* (2013.01); *H10K 50/87* (2023.02); *H04R 2499/15* (2013.01)

(58) Field of Classification Search
CPC ... G06F 3/016; H10K 50/87; G02F 1/133382; H04R 1/028; H04R 9/025; H04R 9/04; H04R 2499/15
See application file for complete search history.

(56) References Cited

U.S. PATENT DOCUMENTS

| | | |
|---|---|---|
| 9,681,217 B2 | 6/2017 | Mihelich et al. |
| 10,009,683 B2 | 6/2018 | Choi et al. |
| 10,313,801 B2 | 6/2019 | Park et al. |
| 10,365,685 B2 * | 7/2019 | Lee .......................... H04R 7/045 |
| 10,409,325 B2 * | 9/2019 | Choi ...................... G06F 1/1688 |
| 10,567,880 B2 * | 2/2020 | Ham ........................ H04R 9/06 |

(Continued)

FOREIGN PATENT DOCUMENTS

| | | |
|---|---|---|
| CN | 108877597 A | 11/2018 |
| CN | 109308849 A | 2/2019 |

(Continued)

OTHER PUBLICATIONS

Office Action dated Dec. 27, 2022, issued in counterpart Chinese Patent Application No. 202011301052.4.

(Continued)

*Primary Examiner* — Doon Y Chow
*Assistant Examiner* — Dennis Chow
(74) *Attorney, Agent, or Firm* — Morgan, Lewis & Bockius LLP

(57) ABSTRACT

A display apparatus includes a display panel configured to display an image; and a vibration generating device configured to vibrate the display panel to generate sound, wherein the vibration generating device includes: a first sound generating device at a rear surface of the display panel, and outputting a first sound; and a second sound generating device around the first sound generating device, and outputting a second sound.

20 Claims, 13 Drawing Sheets

(56) References Cited

U.S. PATENT DOCUMENTS

| | | |
|---|---|---|
| 10,771,730 B2 | 9/2020 | Lee et al. |
| 10,820,082 B2 | 10/2020 | Lee |
| 10,911,851 B2* | 2/2021 | Noh ................. H04R 1/24 |
| 2006/0120542 A1 | 6/2006 | Lee et al. |
| 2015/0341714 A1* | 11/2015 | Ahn ............... H04R 1/028 |
| | | 381/333 |
| 2016/0150318 A1* | 5/2016 | Donarski ............ H04R 3/14 |
| | | 381/104 |
| 2017/0127166 A1* | 5/2017 | Noma ............. G02B 6/0088 |
| 2017/0280234 A1 | 9/2017 | Choi et al. |
| 2018/0332376 A1 | 11/2018 | Lee |
| 2019/0037165 A1 | 1/2019 | Lee et al. |
| 2019/0098411 A1* | 3/2019 | Ham ............... H04R 1/025 |

FOREIGN PATENT DOCUMENTS

| | | |
|---|---|---|
| CN | 109561374 A | 4/2019 |
| CN | 109714684 A | 5/2019 |
| KR | 10-0609914 B1 | 8/2006 |
| KR | 10-2016-0103489 A | 9/2016 |
| KR | 10-1704517 B1 | 2/2017 |

OTHER PUBLICATIONS

Office Action dated Jul. 8, 2023, issued in corresponding Chinese Patent Application No. 202011301052.4.

\* cited by examiner

DISPLAY APPARATUS

CROSS-REFERENCE TO RELATED APPLICATIONS

This application claims the priority benefit of the Korean Patent Application No. 10-2019-0154859 filed in the Republic of Korea on Nov. 27, 2019, the entirety of which is hereby expressly incorporated by reference as if fully set forth herein into the present application.

BACKGROUND

Technical Field

The present disclosure relates to a display apparatus.

Discussion of the Related Art

Recently, as society advances to the information-oriented society, the display field of display apparatuses for visually displaying an electric information signal has rapidly advanced. Various display apparatuses having excellent performances such as thinness, lightness, and low power consumption are being developed correspondingly.

Examples of the display apparatuses include a liquid crystal display (LCD) apparatus, a field emission display (FED) apparatus, and an organic light emitting display (OLED) apparatus, etc.

Among the display apparatuses, the liquid crystal display apparatus comprises an array substrate including a thin film transistor, an upper substrate including a color filter and/or a black matrix, and a liquid crystal layer between the array substrate and the upper substrate. An arrangement state of the liquid crystal layer is controlled with an electric field applied between two electrodes in a pixel area, and transmittance of light is controlled in accordance with the arrangement state of the liquid crystal layer to display an image.

The organic light emitting display apparatus, which is a self-light emitting diode, and is more advantageous than the other display apparatuses in view of a fast response time, high emission efficiency, excellent luminance and a viewing angle. The display apparatuses display an image on a display panel, and an additional speaker should be installed to provide sound. If the speaker is provided in the display apparatus, a traveling direction of sound output through the speaker is a direction toward a lower or rear portion of the display panel where an image is displayed, instead of a front portion of the display panel. Thus, the sound does not travel in a direction toward a viewer who views an image on the front surface of the display panel. For this reason, a problem occurs in that interrupts an immersion experience of a viewer who views an image.

In addition, the sound output through a speaker travels to a lower or rear portion of the display panel, so sound quality is deteriorated due to interference of sound reflection from a wall or a floor.

Further, when a speaker in a set apparatus, such as television (TV) set, laptop computer or computer monitor is provided, the speaker occupies a certain space, so the design and space arrangement of the set apparatus may be limited.

Accordingly, the inventors of the present disclosure recognized the above-described problems and conducted various experiments so that when watching an image in front of a display panel, a traveling direction of sound becomes a direction toward a front surface of the display panel, and thus, sound quality is enhanced. Through the various experiments, the inventors have invented a display apparatus having a new structure, which may output sound so that a traveling direction of the sound becomes a direction toward a front surface of the display panel, thereby enhancing sound quality.

SUMMARY

Accordingly, embodiments of the present disclosure are directed to a display apparatus that substantially obviates one or more of the issues due to limitations and disadvantages of the related art.

An aspect of the present disclosure is to provide a display apparatus including a vibration generating device capable of outputting sound to a forward direction in front of a display panel.

Another aspect of the present disclosure is to provide a display apparatus including a vibration generating device having a new structure for realizing a low-pitched sound band.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and claims hereof as well as the appended drawings.

To achieve these and other aspects of the inventive concepts, as embodied and broadly described, a display apparatus comprises a display panel configured to display an image; and a vibration generating device configured to vibrate the display panel to generate sound. The vibration generating device includes: a first sound generating device at a rear surface of the display panel, and outputting a first sound; and a second sound generating device around the first sound generating device, and outputting a second sound.

In another aspect, a display apparatus comprises a display panel including a first area and a second area, and configured to display an image; a first vibration generating device at the first area at a rear surface of the display panel; a second vibration generating device at the second area at the rear surface of the display panel; a first partition surrounding the first vibration generating device; and a second partition surrounding the second vibration generating device. Each of the first vibration generating device and the second vibration generating device includes: a first sound generating device outputting a first sound; and a second sound generating device around the first sound generating device, and outputting a second sound different from the first sound.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. A display apparatus according to an embodiment of the present disclosure includes the vibration generating device that vibrates the display panel to generate sound, the display apparatus may output sound to a forward region in front of the display panel, thereby enhancing an immersion experience of a viewer watching an image displayed by the display apparatus.

A display apparatus according to an embodiment of the present disclosure includes a vibration generating device capable of improving a sound of a low-pitched sound band to high-pitched sound band by implementing or supplementing the low-pitched sound band.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles.

Figure 1A:
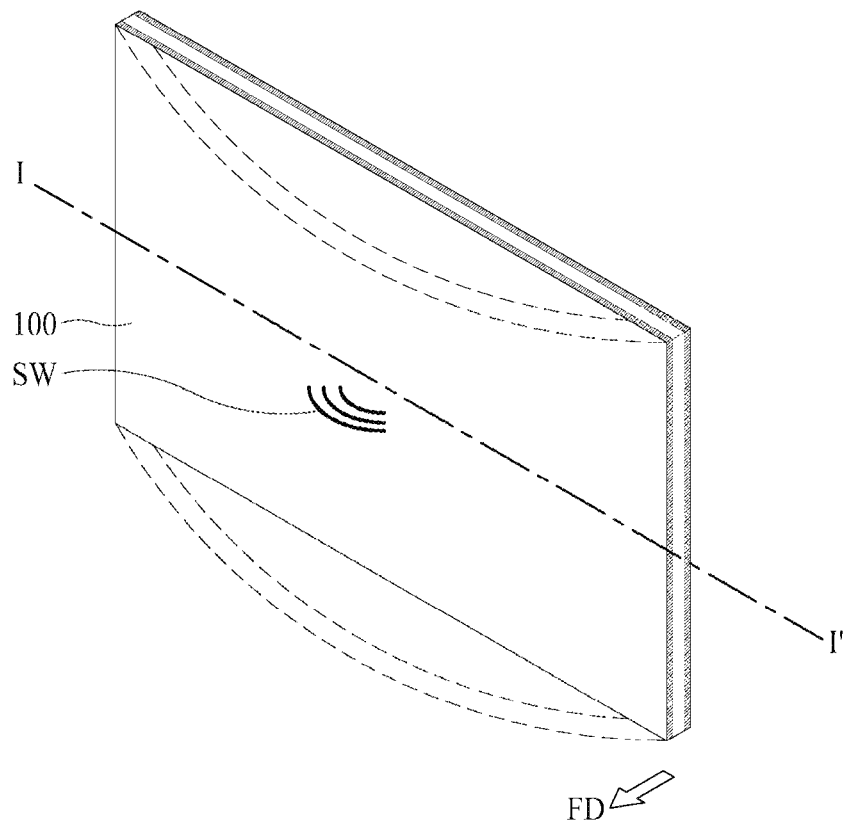
FIG. 1A illustrates a display apparatus including a sound generating device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only" is used. The terms of a singular form may include plural forms unless referred to the contrary.

In construing an element, the element is construed as including an error range although there is no explicit description of such an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used. In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X axis direction", "Y axis direction" and "Z axis direction" may not be interpreted only as a geometric relationship in which the relationship between each other is perpendicular, and may mean that the configuration of the present disclosure has a wider scope to the extent that it may functionally work.

In describing elements of the present disclosure, the terms "first," "second," "A," "B," "(a)," "(b)," etc. may be used. These terms are intended to identify the corresponding elements from the other elements, and basis, order, or number of the corresponding elements should not limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the present disclosure, a "display apparatus" may comprise a liquid crystal module (LCM) or an organic light emitting display module (OLED), which includes a display panel and a driver for driving the display panel. The display apparatus may include a set electronic apparatus or set device (or set apparatus), such as a notebook computer, a television, a computer monitor, an automotive apparatus, an equipment apparatus of another vehicle type, and a mobile electronic apparatus such as a smartphone or an electronic pad, which correspond to complete products or final products including an LCM and an OLED module.

Therefore, in the present disclosure, the display apparatus may include a display apparatus itself, such as the LCM or the OLED module, and may also include a set apparatus which is a final consumer apparatus or an application product including the LCM or the OLED module.

In some examples, the LCM or the OLED module including a display panel and a driver may be referred to as a "display apparatus" in a narrow sense, and the electronic apparatus as a final product including the LCM or the OLED module may be referred to as a "set apparatus". For example, the display apparatus in a narrow sense may include a display panel, such as an LCD or an OLED, and a source printed circuit board (PCB) as a controller for driving the display panel, and the set apparatus may further include a set PCB that is a set controller electrically connected to the source PCB to control the overall operations of the set apparatus.

As the display panel in the present disclosure, all kinds of display panels such as a liquid crystal display panel, an organic light emitting diode (OLED) display panel, and an electroluminescent display panel may be used. The display panel in this embodiment is not limited to a specific display panel that may be vibrated by a sound generator to generate a sound. A shape or size of the display panel used in the display apparatus according to the embodiment of the present disclosure is not limited.

For example, when the display panel is a liquid crystal display panel, the display panel includes a plurality of gate and data lines, and pixels formed in crossing areas of the gate lines and the data lines. Also, the display panel may include an array substrate including a thin film transistor which is a switching element for controlling light transmittance in each pixel, an upper substrate including a color filter and/or a black matrix, and a liquid crystal layer formed between the array substrate and the upper substrate.

Moreover, when the display panel is an OLED display panel, the display panel may include a plurality of gate and data lines, and pixels formed in crossing areas of the gate lines and the data lines. Also, the display panel may include an array substrate including a thin film transistor, which is an element for selectively applying a voltage to each pixel, an organic light emitting diode (OLED) layer on the array substrate, and an encapsulation substrate arranged on the array substrate to cover the OLED layer. The encapsulation substrate may protect the thin film transistor and the OLED layer from external impact, and may prevent water or oxygen from penetrating into the OLED layer. The layer formed on the array substrate may include an inorganic light emitting layer, for example, nano-sized material layer or quantum dot.

The display panel may further include a backing, such as a metal plate, attached to a rear surface thereof. However, embodiments are not limited to the metal plate, and the display apparatus may include other structures.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments according to the present disclosure will be described in detail with reference to the accompanying drawings.

Figure 1B:
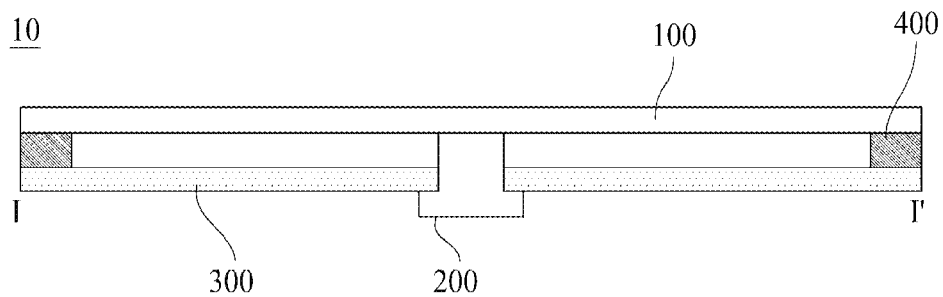
FIG. 1B is a cross-sectional view taken along line I-I' of FIG. 1A.

FIG. 1A illustrates a display apparatus including a sound generating device according to one embodiment of the present disclosure. FIG. 1A illustrates a front surface of the display apparatus. FIG. 1B is a cross-sectional view along the cutting line I-I' in FIG. 1A. With reference to FIGS. 1A and 1B, a display apparatus 10 may comprise a display panel 100 for displaying an image, a sound generating device 200 and a support member 300. The sound generating device 200 may generate a sound SW in a forward direction FD of the display panel 100 by vibrating the display panel 100. The sound generating device 200 may be disposed at the rear surface of the display panel 100. The rear surface of the display panel 100 may be referred to as one surface, a first surface, rear surface or lower surface, but embodiments are not limited thereto.

The display panel 100, which may display an electronic image or a digital image, may be implemented as any type of display panel including a liquid crystal display panel, an organic light emitting diode (OLED) display panel or an electroluminescent display panel. The display panel 100 may be vibrated in accordance with a vibration of the sound generating device 200, so it may output the sound SW in the forward direction FD of the display panel 100.

For example, the display panel 100 may display video images in a top emission type, a bottom emission type or a dual emission type in accordance with a pixel array structure having an anode electrode, a cathode electrode, and an organic light emitting layer. In the top emission type, the video image or image may be represented by providing the visible lights emitted from the pixel array layer to the front of a base substrate. In the bottom emission type, the video image or image may be represented by providing the visible lights emitted from the pixel array layer to a rearward region of the base substrate.

The sound generating device 200 may generate sound using the display panel 100 as a vibration plate. The sound generating device may be referred to as an "actuator," an "exciter," or a "transducer," but embodiments are not limited thereto. For example, the sound generating device 200 may be an acoustic device or sound device for generating or outputting sound according to an electric signal.

The supporting member may support one or more of a rear surface and a side surface (or a lateral surface) of the display panel 100. The sound generating device 200 may be disposed at the supporting member 300.

For example, the supporting member 300 may be a cover bottom. For example, the supporting member 300 may include a middle cabinet, which may be coupled or connected to a cover bottom to surround the side surface (or a lateral surface) of the display panel 100 and accommodate one edge or periphery of the display panel 100 to support the display panel 100. The middle cabinet may have "⊥-shaped" cross-sectional surface. The supporting member 300 may include the cover bottom, or may include the cover bottom and the middle cabinet, but embodiments are not limited thereto. The supporting member 300 may have any structure that supports the rear surface and/or the side surface of the display panel 100.

The supporting member 300 may have a plate shape covering over some or all of rear surface of the display panel 100. For example, the supporting member 300 may be a flat substrate formed of a glass material, a metal material or a plastic material. For example, an edge or a sharp corner of the supporting member 300 may have a tetragonal (e.g., quadrilateral) shape or a curved shape through chamfering process or a rounded rectangular shape in which sharped corner is through a chamfer process or a corner rounding process. For example, the supporting member 300 of the glass material may be formed of a sapphire glass. Otherwise, the supporting member 300 including the metal material may be formed one or more of aluminum (Al), aluminum alloy, magnesium (Mg) alloy, or an iron (Fe)-nickel (Ni) allay. In another example, the supporting member 300 may have a stacked structure including a metal plate and a glass plate, the metal plate may have a thickness relatively thinner than the glass plate, and the glass plate may face the rear surface of the display panel 100. In this case, the rear surface of the display panel 100 may be used as a mirror surface. However, embodiments are not limited thereto.

The supporting member 300 may further include a hole which the sound generating device 200 may be inserted or accommodated. For example, the hole may be bored in a certain partial region of the supporting member 300 along a thickness direction of the supporting member 300 to have a circular shape or a polygonal shape, for the sound generating device 200 to be inserted or accommodated into the hole.

The supporting member 300 may be referred to as a cover bottom, a plate bottom, a back cover, a base frame, a metal frame a metal chassis, a chassis base, or a m-chassis, and so on. Therefore, the supporting member 300 may be any frame structure or any plate structure disposed at the rear surface of the display panel 100 for supporting the display panel 100.

An adhesive member 400 may be disposed at an edge or periphery of the display panel 100 and the supporting member 300. For example, the adhesive member 400 may be disposed between the rear surface of the display panel 100 and the upper surface or front surface of the supporting member 300. The adhesive member 400 may attach the display panel 100 and the supporting member 300. The adhesive member 400 may include a double-sided tape, a single-sided tape, an adhesive agent, bond (or glue agent), and/or the like, but embodiments are not limited thereto.

Figure 2A:
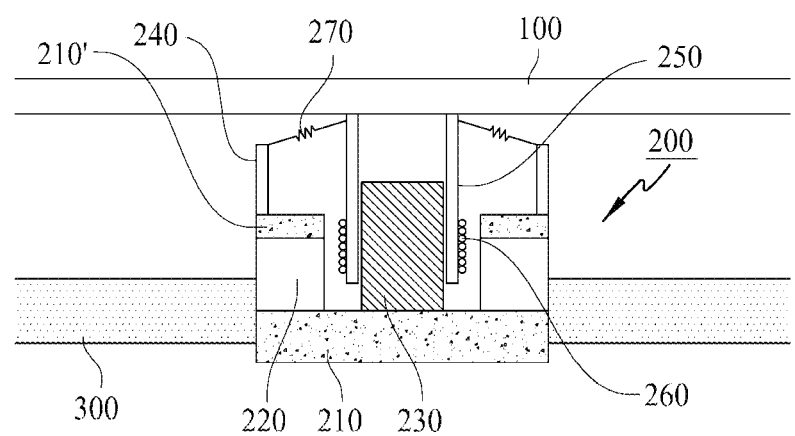
FIGS. 2A and 2B are cross-sectional views illustrating a sound generating device according to an embodiment of the present disclosure.
Figure 2B:
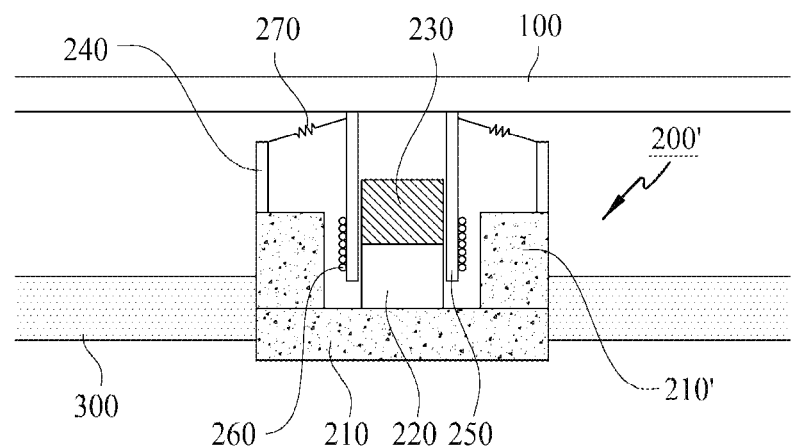

FIGS. 2A and 2B are cross-sectional views illustrating a sound generating device according to an embodiment of the present disclosure.

The sound generating device 200 may be classified into a first structure where a magnet may be outside a coil and a second structure where a magnet may be inside a coil. The first type may be referred to as a dynamic type or an external magnetic type. The second type may be referred to as a micro type or an internal magnetic type.

FIG. 2A illustrates the first structure of the sound generating device, and FIG. 2B illustrates the second structure of the sound generating device.

With reference to FIG. 2A, the sound generating device 200 may include plates 210 and 210', a magnet 220 on the plate 210, a center pole on the plate 210, a bobbin 250 disposed around the center pole 230 and a coil 260 wound around the bobbin 250.

For example, the magnet 220 is disposed on the first plate 210, and the second plate 210' may be disposed on the magnet 220. The first plate 210 and the second plate 210' may support the magnet 220 and fix the sound generating device 200 to the supporting member 300. Therefore, the first plate 210 may be fixed to a supporting hole of the supporting member 300, and the magnet 220 may be fixedly supported between the first plate 210 and the second plate 210'.

At least one of the first plate 210 and/or the second plate 210' may be formed of metal material such as iron (Fe). The first and second plates 210 and 210' are not limited to these terms. For example, the first and second plates 210 and 210' may be referred to as other terms such as "yoke" and so on.

The magnet 220 may include a sintered magnet such as the barium ferrite. The material of the magnet 220 may include of iron (III) oxide ($Fe_2O_3$), barium carbonate (or witherite) ($BaCO_3$), neodymium (Nd) magnet, strontium ferrite ($Fe_{12}O_{19}Sr$) with improved magnetic component, an alloy cast magnet including aluminum (Al), nickel (Ni), and cobalt (Co), and/or the like. However, embodiments are not limited thereto.

A frame 240 may be disposed on the second plate 210' along the periphery of the first plate 210. A center pole 230 may be disposed on a center portion of the first plate 210. The center pole 230 and the first plate 210 may be formed as one body to a single structure body. The center pole 230 may be referred to as pole pieces. As another example, the pole pieces may be further disposed on the center pole 230.

A bobbin 250 may surround a periphery of the center pole 230. A coil 260 may be wound around some lower portions of the bobbin 250. For example, the coil 260 may be wound around a lower outer surface of the bobbin 250. A current or a voice signal for generating sound may be applied to the coil 260.

The bobbin 250 may be a ring (or cylindrical) structure including a material processed with pulp or paper, aluminum or magnesium or an alloy thereof, a synthetic resin such as polypropylene, or a polyamide-based fiber, etc., but embodiments are not limited thereto. The bobbin 250 and the coil 60 may be combined and referred to as a voice coil.

A damper 270 may be disposed between upper portion of the bobbin 250 and the frame 240. The damper 270 may be referred to as an edge, a spider or a suspension, but embodiments are not limited thereto.

FIG. 2B illustrates the second structure where a magnet may be disposed inside a coil.

With reference to FIG. 2B, the sound generating device 200' of the second structure may comprise a magnet 220 disposed on a first plate 210, a center pole 230 on the magnet 220, a bobbin 250 surrounding the magnet 220 and the center pole 230, and a coil 260 wound around the bobbin 250.

For example, the first plate 210 may be fixed to a supporting hole at the supporting member 300. The magnet 220 may be disposed on the first plate 210, the center pole 230 may be disposed on the magnet 220. The center pole 230 may be referred to as a pole piece. For example, the pole piece may be further included on the center pole 230.

The bobbin 250 may surround the magnet 220 and the center pole 230, and the coil 260 may wound around the outer surface of the bobbin 250.

The second plate 210' may be arranged around the outer periphery of the first plate 210. A frame 240 may be disposed around the second plate 210'. For example, a damper 270 may be disposed between the frame 240 and the bobbin 250.

Compared to the first structure where the magnet is disposed outside the coil, the second structure where the magnet is inside the coil has advantages of small in leakage magnetic flux and may reduce an entire size of the sound generating device.

The sound generating device applied to the display apparatus according to and embodiment of the present disclosure is not limited to the structures illustrated in FIG. 2A and FIG. 2B. For example, any sound generating device generating the sounds by vibrating the display panel directly may be used.

Figure 3A:
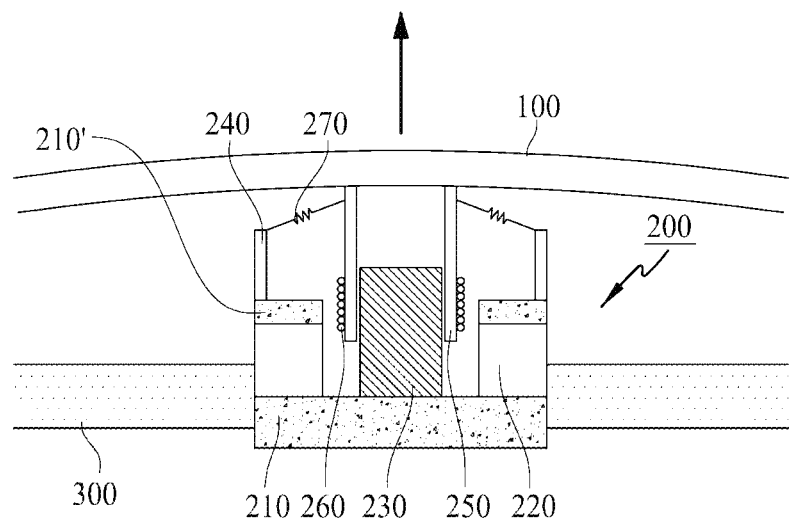
FIGS. 3A and 3B illustrate a sound generating device with a first structure according to an embodiment of the present disclosure.
Figure 3B:
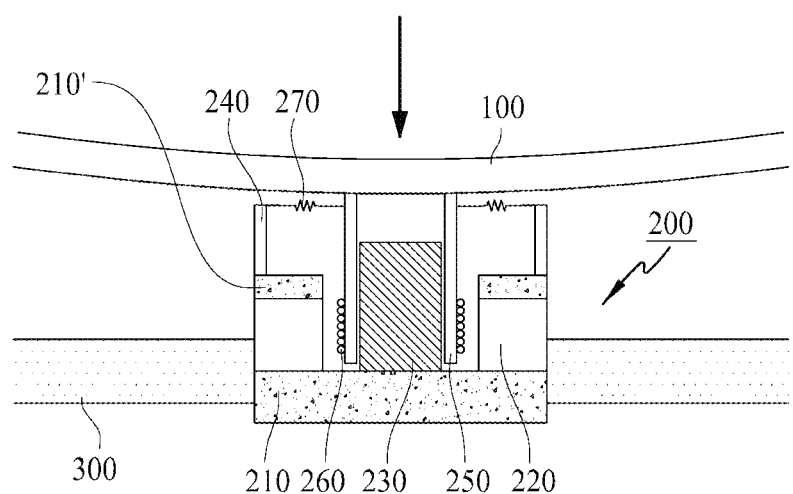

FIGS. 3A and 3B illustrate a sound generating method of the sound generating device with a first structure according to an embodiment of the present disclosure.

FIG. 3A shows a state in which a current may be applied.

The the center pole 230 connected with a lower surface of the magnet 220 may be a north (N)-pole, and the second plate 210' connected with an upper surface of the magnet 220 may be a south (S)-pole, whereby an external magnetic field is generated around the coil 260.

In this state, when a current for generating sound is applied to the coil 260, an application magnetic field may be generated around the coil 260, whereby a force for moving the bobbin 250 to an upper portion may be generated by the application magnetic field and an external magnetic field. For example, when a current is applied to the coil 260, an application magnetic field is generated around the coil 260. Thus, the entire bobbin 250 may be guided by the center pole 230 and may move to upper portion according to Fleming's Left-Hand Rule for Motors based on the application magnetic field and the external magnetic field generated by the magnet 220.

Accordingly, one surface of the bobbin 250 may be contact a rear surface of the display panel 100. Thus, the bobbin 250 may vibrate the display panel 100 in an upward direction (illustrated by an arrow) according to whether a current is applied to the coil 260 or not, and a sound wave (or sound) may be generated by the vibration of the display panel 100. In this state, when the application of the current is not applied or a reverse current is applied, as shown in FIG. 3B, a force for moving the bobbin 250 may be generated to a lower side may be generated based on the principle similar to description given above with reference to FIG. 3A. Then, the display panel 100 may vibrate to downward direction (illustrated by an arrow). Accordingly, the sound (or acoustic wave) may be generated by the vibration of the display panel 100.

The damper 270 may be disposed between the frame 240 and a portion of an upper portion of the bobbin 250. The damper 270 may be provided in a wrinkled or creased structure having the elastic property. The damper 270 may be contracted and relaxed based on a vertical motion of the bobbin 250 to control a vertical vibration of the bobbin 250. For example, as the damper 270 may be connected to the bobbin 250 and the frame 240. Thus, the vertical vibration of the bobbin 250 may be adjusted by a restoring force of the damper 270. For example, when the bobbin 250 vibrates by a certain height or more or vibrates by a certain height or less, the bobbin 250 may be restored an original position by the restoring force of the damper 270.

Accordingly, the display panel 100 may vertically vibrate based on an application direction and level of a current applied to the coil 260, to thereby generate the sound wave by the vibration.

Figure 4A:
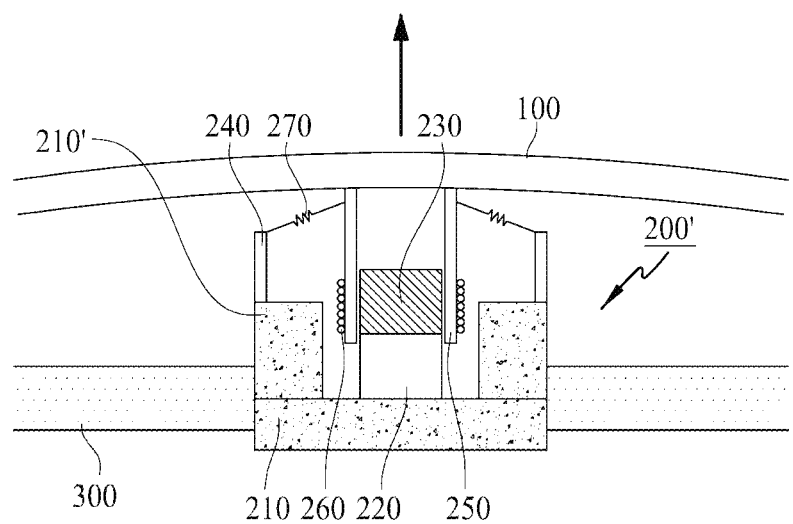
FIGS. 4A and 4B illustrate a sound generating device with a second structure according to an embodiment of the present disclosure.
Figure 4B:
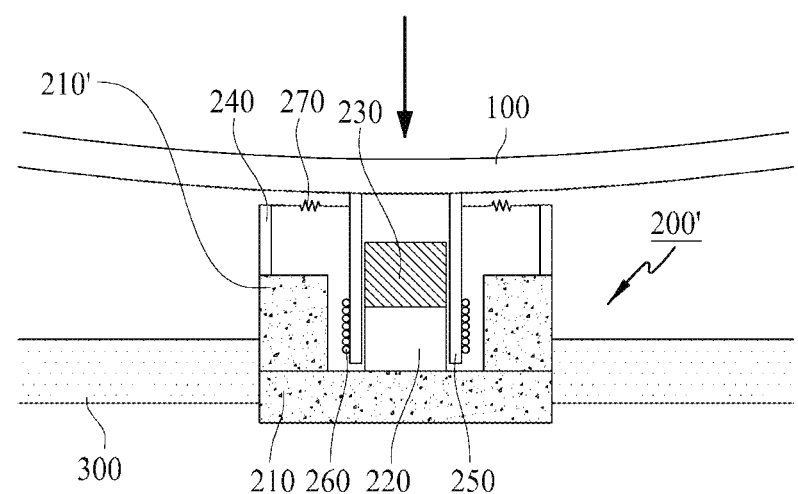

FIGS. 4A and 4B illustrate a sound generating method of the sound generating device with a second structure according to an embodiment of the present disclosure.

FIG. 4A illustrates a state in which a current may be applied.

The second plate 210' may be an S pole, and the center pole 230 connected to an upper surface of the magnet 220 may be a N pole, whereby ab external magnetic field may be generated around the coil 260. Here, the N pole and the S pole may switch there-between, if the S-pole and the N-pole switches there-between, the sound generating device may identically operate by correcting a winding direction of the coil 260. In this state, when a current for generating sound is applied to the coil 260, an application magnetic field may be generated around the coil 260, and a force for moving the bobbin 250 to an upper side may be generated by the application magnetic field and an external magnetic field. For example, when a current is applied to the coil 260, an application magnetic field may be generated around the coil 260. Thus, the entire bobbin 250 may be guided by the center pole 230 and may move to the upper side according to the Fleming's Left-Hand Rule for Motors based on the application magnetic field and the external magnetic field generated by the magnet 220.

Accordingly, one surface of the bobbin 250 may contact a rear surface of the display panel 100. Thus, the bobbin 250 may vibrate the display panel 100 in an upward direction (illustrates by an arrow) according to whether a current is applied to the coil 260 or not, and a sound wave (or sound) may be generated by the vibration of the display panel 100. In this state, when the application current stops or a reverse current is applied, as illustrated in FIG. 4B, a force for moving the bobbin 250 to a lower side may be generated according to the principle similar to description given above with reference to FIG. 4A. Then, the display panel 100 may vibrate in a downward direction. Accordingly, the sound (or acoustic wave) may be generated by the vibrations of the display panel 100.

The damper 270 may be disposed between the frame 240 and a partial portion of an upper portion of the bobbin 250. The damper 270 may be provided in a wrinkled or creased structure having elasticity and may be contracted and relaxed based on a vertical motion of the bobbin 250 to control a vertical vibration of the bobbin 250. For example, as the damper 270 may be connected to the bobbin 250 and the frame 240. Thus, the vertical vibration of the bobbin 250 may be adjusted by a restoring force of the damper 270. For example, when the bobbin 250 vibrates by a certain height or more or vibrates by a certain height or less, the bobbin 250 may be restored to an original position by the restoring force of the damper 270.

Accordingly, the display panel 100 may vertically vibrate based on an application direction and level of a current applied to the coil 260, to thereby generate the sound wave by the vibration.

Figure 5:
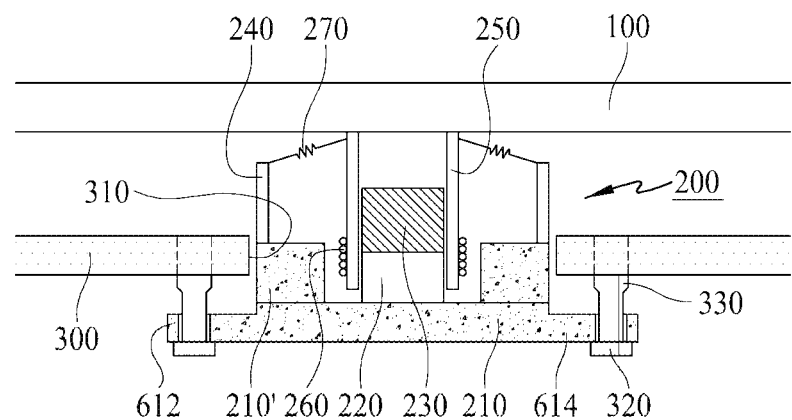
FIG. 5 illustrates a display apparatus including the sound generating device according to an embodiment of the present disclosure.

FIG. 5 illustrates a display apparatus including the sound generating device according to an embodiment of the present disclosure.

In an embodiment of the present disclosure, any of a sound generating device having the first structure and a sound generating device having the second structure may be applied. Hereinafter, a sound generating device having the second structure will be described as an example.

With reference to FIG. 5, a sound generating device 200 may include a diameter enlargement part 614. The diameter enlargement part 614 may be provided as one body or a single structure body with a first plate 210. A first plate 210 may not have cylindrical shape or a cylinder shape. One side of the first plate 210 may include a protrusion that may be greater than other portion of the first plate 210. The protrusion region with an enlarged diameter may be referred to as a diameter enlargement part 614. The diameter enlargement part 614 may have a disc shape or a ring shape. An extension part 612 may be further provided at some portions of the diameter enlargement part 614 for fixing the sound generating device 200.

A screw 320 and a nut 330 may be in the extension part 612. The sound generating device 200 may be coupled or connected to a supporting member 300 by the screw 320 using the nut 330 fixed to the supporting member 300. The nut 330 may be, for example, a self-clinching nut. An example of the self-clinching nut may include a PEM® nut, but embodiments are not limited thereto. Accordingly, the sound generating device 200 may be accommodated into a supporting hole 310 at the supporting member 300.

If the self-clinching nut is used, a portion of a vibration generated by the sound generating device 200 may be absorbed by the self-clinching nut 330, which may be the nut 330. Thus, a vibration transferred to the supporting member 300 may be reduced. And, the display panel 100 may be attached or coupled on the bobbin 250 of the sound generating device 200.

As described with reference to FIG. 5, the sound generating device may be coupled or connected to the display panel through a supporting hole of the supporting member. Therefore, a rear surface of the supporting hole may need the supporting hole. There may be a problem where foreign materials or external particles may penetrate into the inside of the display panel through the supporting hole. Further, because the sound generating device may be exposed at the rear surface of the supporting member, there may be problem that an aesthetic sense of the appearance or a sense of beauty in appearance may be reduced by the sound generating device exposed at the rear surface of the supporting member. Since a protection cover for protecting the sound generating device may be needed for preventing damage of the sound generating device exposed at the rear surface of the supporting member, there may be a problem in which a process of adding the protection cover may be needed or a thickness of the sound generating device may be thickened due to the protection cover.

Accordingly, the inventors of the present disclosure conducted various experiments to configure the sound generating device, which, may be provided in the display panel without being coupled or connected to the supporting member by the supporting hole of the supporting member. Through the various experiments, the present inventors have recognized that a thickness of the sound generating device should be reduced for configuring the sound generating device in the display panel. When the sound generating device is thick, the thickness of the display panel may be thickened, the image quality of the display panel or an image displayed by the display panel may be adversely affected, and a sense of beauty in appearance is reduced. Further, it may be required that the thickness of the sound generating device should be reduced because a plurality of sound generating devices should be configured for realizing a stereo sound Therefore, to reduce the thickness of the sound generating device, it may be required to reduce the thicknesses of components or elements included in the sound generating device. For example, when a thickness of the magnet is reduced, a magnetic flux density may decrease, causing a problem in which a sound pressure may be lowered. When a thickness (or height) of the bobbin is reduced, a winding width of a coil wound around the bobbin may be reduced. Thus, a magnetic force of the sound generating device may be weakened, causing a problem in which an articulation of a tone may be reduced or a sound pressure may be lowered. Further, the wiring line for supplying the electrical signal to the coil may be transferred to the coil may cause a problem in which an interference sound may occur in the sound generating device due to interference by a damper.

Therefore, through the various experiments, the thickness of the sound generating device may be reduced by widening an area of the sound generating device. A sound generating device having an enhanced new structure without affecting the sound quality than that according to an embodiment of the present disclosure may be provided. This will be described below with reference to FIGS. 6 to 12.

Figure 6:
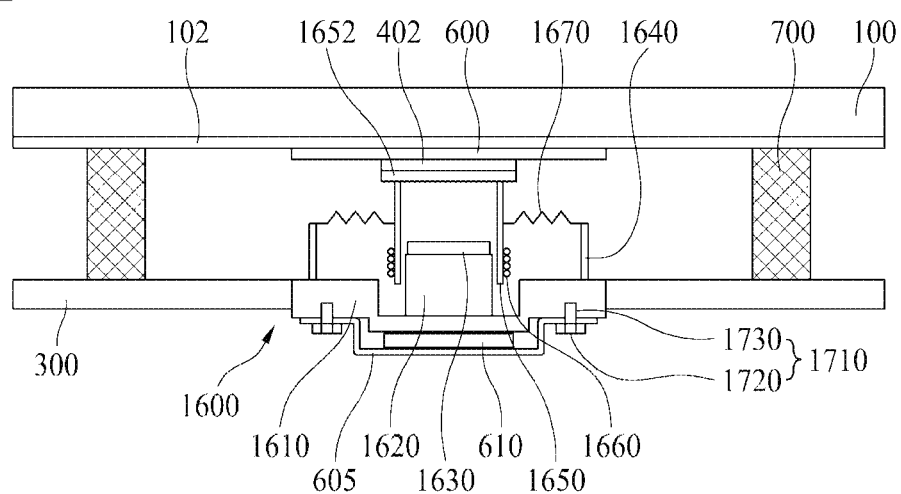
FIG. 6 illustrates a display apparatus including the sound generating device according to another embodiment of the present disclosure.

FIG. 6 illustrates a display apparatus including the sound generating device according to another embodiment of the present disclosure.

In an embodiment of the present disclosure, any of a sound generating device having the first structure and a sound generating device having the second structure may be applied. Hereinafter, a sound generating device having the second structure will be described as an example.

With reference to FIG. 6, a display apparatus 20 according to another embodiment of the present disclosure may comprise a display panel 100 and a sound generating device 1600. An encapsulation substrate 102 may be disposed on the rear surface of the display panel 100. For example, the encapsulation substrate 102 may protect the thin film transistor and the emission element layer (or light emitting device layer) disposed on the display panel 100 from an external impact and may prevent the moisture or oxygen or water from penetrating into the emission element layer. The encapsulation substrate may be referred to as a sealing substrate or protection substrate.

The sound generating device 1600 may include a magnet 1620 on a yoke 1610, a center pole 1630 on the magnet 1620, a bobbin 1650 around the magnet 1620 and the center pole 1630 and a coil 1660 wound around at an outer portion of the bobbin 1650.

A frame 1640 may be disposed outside of the yoke 1610. A damper 1670 may be disposed between the frame 1640 and the bobbin 1650. The description about the sound generating device may be very similar with that explained in FIG. 2, therefore, the same explanation will be omitted.

A bobbin ring 1652 may be further disposed on the bobbin 1650. As disposed between the bobbin 1650 and the display panel 100, the bobbin ring 1652 may transfer the vibration of the bobbin 1650 to the display panel 100. In FIG. 6, the bobbin ring 1652 may be disposed as covering entire area of the bobbin 1650. However, embodiments are not limited thereto, the bobbin ring 1652 may be disposed as corresponding to the bobbin 1652. The bobbin ring 1652 may be attached to the display panel 100 using an adhesive member 402. The adhesive member 402 may include a double-sided tape, a single-sided tape, an adhesive agent or a glue agent (or bond), but embodiments are not limited thereto. As shown in FIG. 6, the adhesive member 402 may be disposed where the sound generating device 1600 is attached to the display panel 100. However, embodiments are not limited thereto, and the adhesive member 402 may be disposed at a whole rear surface of the display panel 100. For example, the adhesive member 402 may be disposed at a whole surface between the rear surface of the display panel 100 and the sound generating device 1600. A partition 700 may be disposed between the display panel 100 and the supporting member 300.

A first heat dissipation member 600 may be disposed at the rear surface of the display panel 100 for reducing or eliminating heat occurring when the sound generating device 1600 vibrates. For example, the first heat dissipation member 600 may be disposed on the rear surface of the encapsulation substrate 102 using the adhesive member 402. The adhesive member 402 may include a double-sided tape, a single-sided tape, an adhesive agent or a glue agent (or bond), but embodiments are not limited thereto. The first heat dissipation member 600 may have larger size than the sound generating device 1600 or may be configured to cover the sound generating device 1600, but embodiments are limited thereto. The first heat dissipation member 600 may be a polygonal plate or a circular plate having a certain thickness, but embodiments are not limited thereto. For example, the first heat dissipation member 600 may be formed of metal material having high thermal conductivity such as aluminum (Al), copper (Cu), silver (Ag) or alloy of thereof, but embodiments are not limited thereto. The first heat dissipation member 600 may be referred to as a heat dissipation sheet, a heat dissipation tape or a heat dissipation pad, but embodiments are not limited thereto. Accordingly, because the first heat dissipation member 600 is provided, an influence of heat occurring when the sound generating device is vibrating may be reduced on the image quality of the display panel 100.

For example, the first heat dissipation member 600 may be attached to the sound generating device 1600 by the adhesive member. The adhesive member may include a double-sided tape, a single-sided tape, an adhesive agent or a glue agent, but embodiments are not limited thereto. For example, the adhesive member may be disposed between the first heat dissipation member 600 and the bobbin ring 1652 of the sound generating device 1600.

The display apparatus 20 according to another embodiment of the present disclosure may further comprise a second heat dissipation member 610 at the rear surface of the sound generating device 1600. For example, the second heat dissipation member 610 may be formed of metal material having high thermal conductivity such as aluminum (Al), copper (Cu), silver (Ag) or alloy of therefore, but embodiments are not limited thereto. The second heat dissipation member 610 may be referred to as a heat dissipation sheet, a heat dissipation tape or a heat dissipation pad, but embodiments are not limited thereto. Accordingly, because the second heat dissipation member 610 is provided, an influence of heat occurring when the sound generating device is vibrating may be reduced on the image quality of the display panel 100.

The display apparatus 20 according to another embodiment of the present disclosure may further comprise a third heat dissipation member 605 at the rear surface of the sound generating device 1600. Because third heat dissipation member 605 may be configured to surround the rear surface of the yoke 1610, an influence of heat occurring when the sound generating device is vibrating may be further reduced on the image quality of the display panel 100. The third heat dissipation member 605 surrounding the rear surface of the sound generating device 1600 may be referred to as a heat dissipation cap, but embodiments are not limited thereto.

The sound generating device 1600 according to another embodiment of the present disclosure may be disposed between the supporting member 300. For example, the sound generating device 1600 may be attached on the rear surface of the display panel 100 by a connection member 1710 connecting to the third heat dissipation member 605. For example, the connection member 1710 may include a screw 1720 and nut 1730. The screw 1720 and the nut 1730 may be disposed inside of the yoke 1610 and the sound generating device 1600 may be disposed in the display panel 100 by the screw 1720 and the nut 1730. For example, the sound generating device 1600 and the third heat dissipation member 605 may be connected by the screw 1720 and the nut 1730. For example, the nut 330 may be a self-clinching nut. An example of the self-clinching nut may include a PEM® nut, but embodiments are not limited thereto. The third heat dissipation member 605 may be formed of metal material having high thermal conductivity such as aluminum (Al), copper (Cu), silver (Ag) or alloy of thereof, but embodiments are not limited thereto. The third heat dissipation member 605 may be referred to as a heat dissipation sheet, a heat dissipation tape or a heat dissipation pad, but embodiments are not limited thereto.

The sound generating device 1600 according to another embodiment of the present disclosure may be disposed between the supporting member 300 by the connection member 1710 connecting between the yoke 1610 and the third heat dissipation member 605 without supporting hole at the supporting member 300. Accordingly, the sound generating device 1600 may be disposed in the display panel 100. For example, the sound generating device 1600 may be disposed between the display panel 100 and the supporting member 300 by the connection member 1710. Therefore, because the sound generating device 1600 may be disposed in the display panel 100, it is not required to form a supporting hole at the supporting member, so the foreign material or external particles may be prevented from penetrating through the supporting hole from external environment. Further, as the sound generating device is not exposed at a rear surface of the supporting member, a display apparatus having an aesthetic appearance may be provided, and damage of the sound generating device may be prevented. It is possible to solve a problem in that a process and manufacturing cost increase due to changes in a shape of the supporting member and the position of the supporting hole according to the size of the display apparatus, which occurs when the supporting hole is configured at the supporting member.

Figure 7:
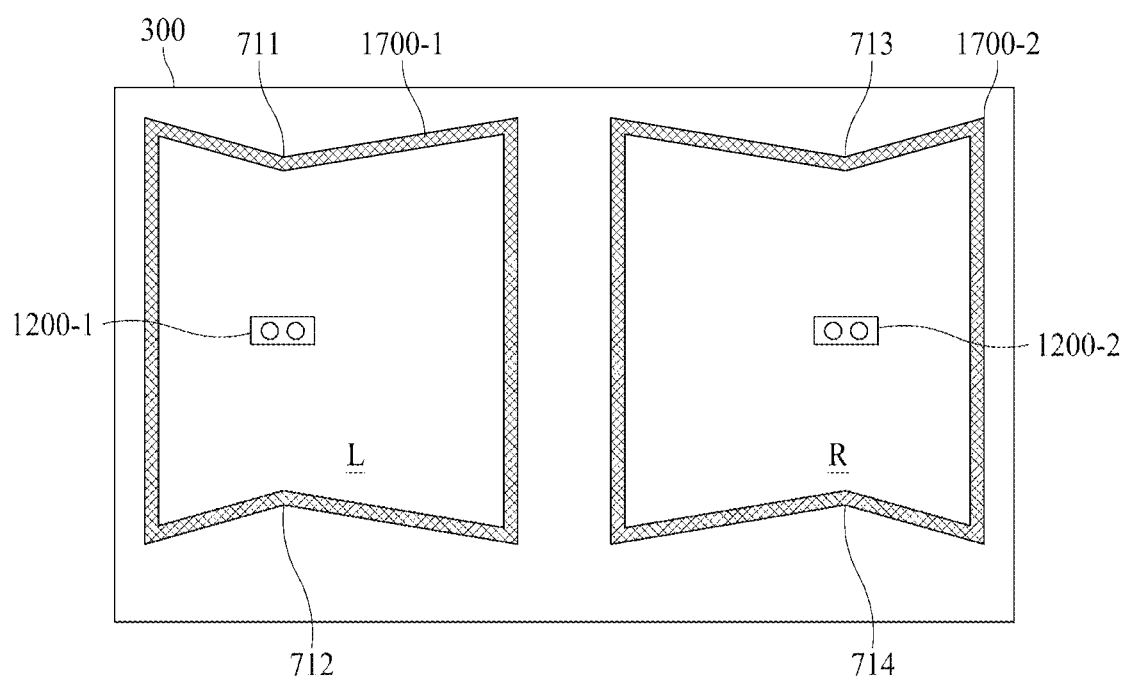
FIG. 7 illustrates a display apparatus including the sound generating device according to another embodiment of the present disclosure.

FIG. 7 illustrates a display apparatus including the sound generating device according to another embodiment of the present disclosure.

With reference to FIG. 7, the display panel 100 may include a first area L and a second area R. The first area L may be a left area at the rear surface of the display panel 100, and the second area R may be a right area at the rear surface of the display panel 100. A first sound generating device 1200-1 may be disposed on the first area L at the rear surface of the display panel 100, and a second sound generating device 1200-2 may be disposed on the second area R at the rear surface of the display panel 100. The first sound generating device 1200-1 and the second sound generating device 1200-2 may be configured as one pair of sound generating devices, respectively. A pair of sound generating device may include two sound generating devices which are disposed in close each other. A description of the sound generating device is the same as the description of FIGS. 2A to 4D, and thus, a detailed description is omitted.

A first partition 700-1 surrounding the first sound generating device 1200-1 and a second partition 700-2 surrounding the second sound generating device 1200-2 may be further included. The first partition 700-1 and the second partition 700-2 may be an air gap or a space where a sound is generated when the display panel 100 vibrates by the first sound generating device 1200-1 and the second sound generating device 1200-2. The first partition 700-1 and the second partition 700-2 may separate a left sound and a right sound generated from the first sound generating device 1200-1 and the second sound generating device 1200-2.

The acoustic (or sound) wave generated as the display panel is vibrated by the sound generating device may be spread radially from a center of the sound generating device and may travel. The sound wave may be referred to as a progressive wave. The progressive wave may be reflected at one side of a partition to generate a reflected wave, and the reflected wave may travel in a direction to opposite to the progressive wave. The reflected wave may overlap and interfere with the progressive wave and does not travel, thereby generating a standing wave that stands at a certain position. A sound pressure may be reduced by the standing wave, and for this reason, a sound output characteristic may be deteriorated. To reduce the sound pressure reduction caused by the standing wave due to the interference between the reflected wave and the progressive wave, a bent portion may be further configured at the partition. The standing wave that causes the sound pressure to be reduced is greatly generated at a position at which a level of a progressive wave and a reflected wave is high. Accordingly, the bent portion may be disposed at a position at which a level of sound wave transferred from the sound generating device is highest.

For example, among the four sides of the first partition 700-1, the bent portion may be disposed at least one or more sides, which a strongest sound wave reaches. For example, a first bent portion 711 and a second bent portion 712 may be configured toward the first sound generating device 1200-1. For example, among the four sides of the second partition 700-2, the bent portion may be disposed at least one or more sides, which a strongest sound wave reaches. For example, a third bent portion 713 and a fourth bent portion 714 may be configured toward the second sound generating device 1200-2. The first to fourth bent portions 711, 712, 713 and 714 may be formed by two rectilinear portions, respectively. The first to fourth bent portions 711, 712, 713 and 714 may be disposed where the two rectilinear portions contact each other. As the result, the sound pressure reduction due to the standing wave may be solved.

Figure 8:
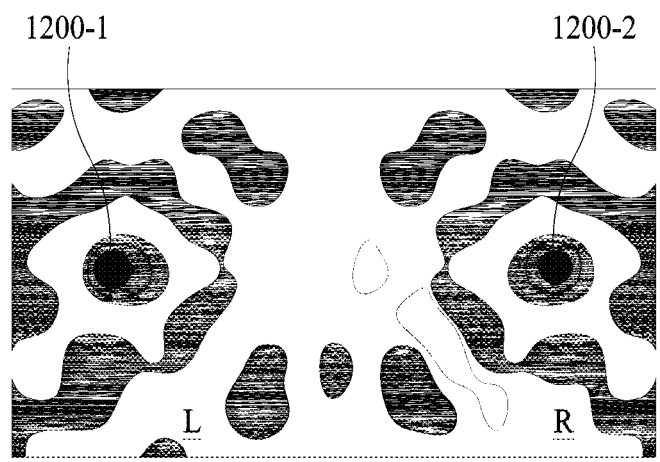
FIG. 8 is a view illustrating the vibration characteristic of the sound generating device according to another embodiment of the present disclosure shown in FIG. 7.

FIG. 8 illustrates a vibration characteristic of the sound generating device according to the embodiment of the present disclosure shown in FIG. 7.

FIG. 8 shows the vibration characteristic of the sound generating device shown in FIG. 7, measured by a laser Doppler device. The laser Doppler device irradiates a laser on a sound vibration surface of a display panel 100 and check (or test) a scattering pattern to check (or determine) a shape in which a vibration spreads, and the checked shape may be displayed as an image. A microphone, through which a sound may be input, is disposed at a center of the display panel, and the measurement has been performed in a state in which a sound travels to the center of the display panel.

In FIG. 8, a region shown as a black represents a portion where a vibration is large, and a blurry or lighter grey portion represents a portion where a vibration is small. For example, when a vibration occurs in the first sound generating device 1200-1 and the second sound generating device 1200-2, a portion shown as dark or black forms a concentric shape, e.g., a circle, and the vibration spreads to a periphery and flows out to the outside. When a larger vibration subsequently occurs, a color of a slightly blurry (e.g., lighter grey) portion and a blurry (e.g., darker grey) portion is changed to dark or black. Lighter grey indicates less vibration.

Figure 9:
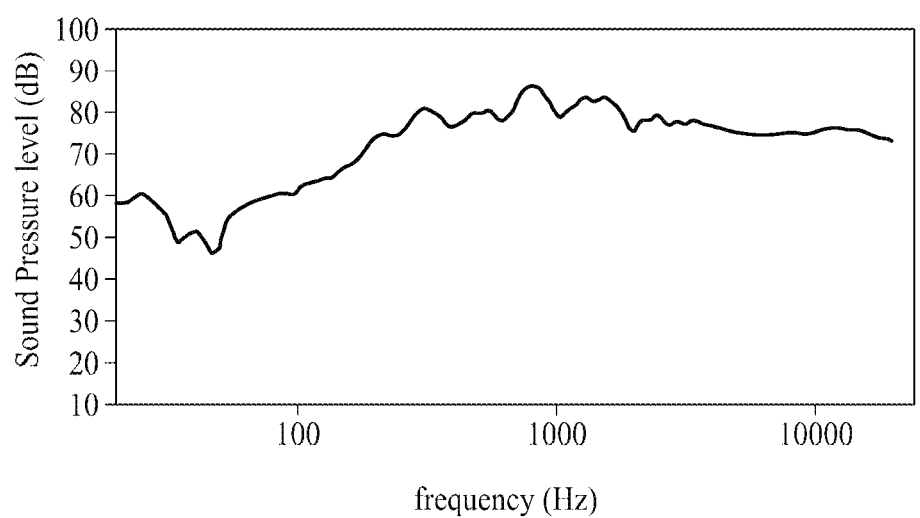
FIG. 9 is a graph illustrating the sound pressure levels of the sound generating device according to another embodiment of the present disclosure shown in FIG. 7.

According to the results of the vibration characteristic using the laser Doppler device, the vibration of the first sound generating device 1200-1 and the second sound generating device 1200-2 of the first area L and the second area R is different each other. For example, the vibration of the first sound generating device 1200-1 at the first area L may be different from the vibration of the second sound generating device 1200-2 at the second area R. For example, the vibration of the second sound generating device 1200-2 may be weaker than the vibration of the first sound generating device 1200-1. As shown in FIG. 8, the region marked in light gray around the first sound generating device 1200-1 may be corresponding to the region marked in dotted light gray around the second sound generating device 1200-2. It means that the vibrations of the first sound generating device 1200-1 and the second sound generating device 1200-2 may be not evenly distributed, but may be formed divided vibration. For example, since the display panel 100 may not have enough stiffness or rigidity, the vibration may be not evenly generated, but be formed to be divided vibration. With reference to FIG. 9, the measured sound output characteristic will be explained.

FIG. 9 illustrates a sound output characteristic of a sound generating device according to an embodiment of the present disclosure.

The sound output characteristics may be measured by a sound analysis equipment. The sound analysis equipment may include a control personal computer (PC), a sound card for transmitting or receiving a sound, an amplifier for amplifying and sending the sound from the sound card to the sound generating device, and a microphone which collects a sound generated by the sound generating device at a display panel. The sound collected through the microphone may be input to the control PC through the sound card. Then, a control program may check the input sound to analyze the sounds of the sound generating device.

FIG. 9 shows a measurement result of the sound output characteristic of the sound generating device as illustrated in FIG. 7. In FIG. 9, the abscissa axis (x-axis) represents a Frequency in hertz (Hz), and the ordinate axis (y-axis) represents a sound pressure level (SPL) in decibel (dB).

With reference to FIG. 9, it is shown that a sound pressure level is reduced in about 200 Hz or less corresponding to the low-pitched sound band. For example, the sound pressure level is reduced in about 180 Hz or less. For example, it is shown that the sound pressure level in about 1 kHz corresponding to the middle-pitched sound band is about 87 dB, and the sound pressure level in about 180 Hz corresponding to the low-pitched sound band is about 60 dB. Therefore, the sound pressure level in the low-pitched sound band is lower than that in the middle-high-pitched sound band. Here, the middle-pitched sound band may refer to 200 Hz to 3 kHz, the high-pitched sound band may refer to 3 kHz or more, and the low-pitched sound band may refer to 200 Hz or less, but embodiments are not limited thereto.

Accordingly, the inventors of the present disclosure conducted several experiments capable of supplementing or improving the sounds of low-pitched sound band. The inventors of the present disclosure recognized that a separate woofer may be provided to supplement the low-pitched sound band when one sound generating device is configured. When a separated woofer is provided, the inventors recognized that there was a space limitation, and the space occupied by the woofer may be secured, so that the degree of freedom in design of the display apparatus is degraded. Therefore, it was recognized that a sound generating device supplementing the low-pitched sound band may be further provided. It is preferable that it may be arranged without a separate arrangement space in consideration of the freedom in designing the display apparatus, in order to implement a separated sound generating device in the display panel. It is preferable that it may be disposed on one structure, in order for a separated sound generating device to be disposed on the display panel. Finally, the inventors of the present disclosure configure two sound generating devices in one frame so that a new structure of the sound generating device capable of improving the low-pitched sound band without a separated space in which the sound generating device having a low-pitched sound band is disposed. This will be described below.

Figure 10:
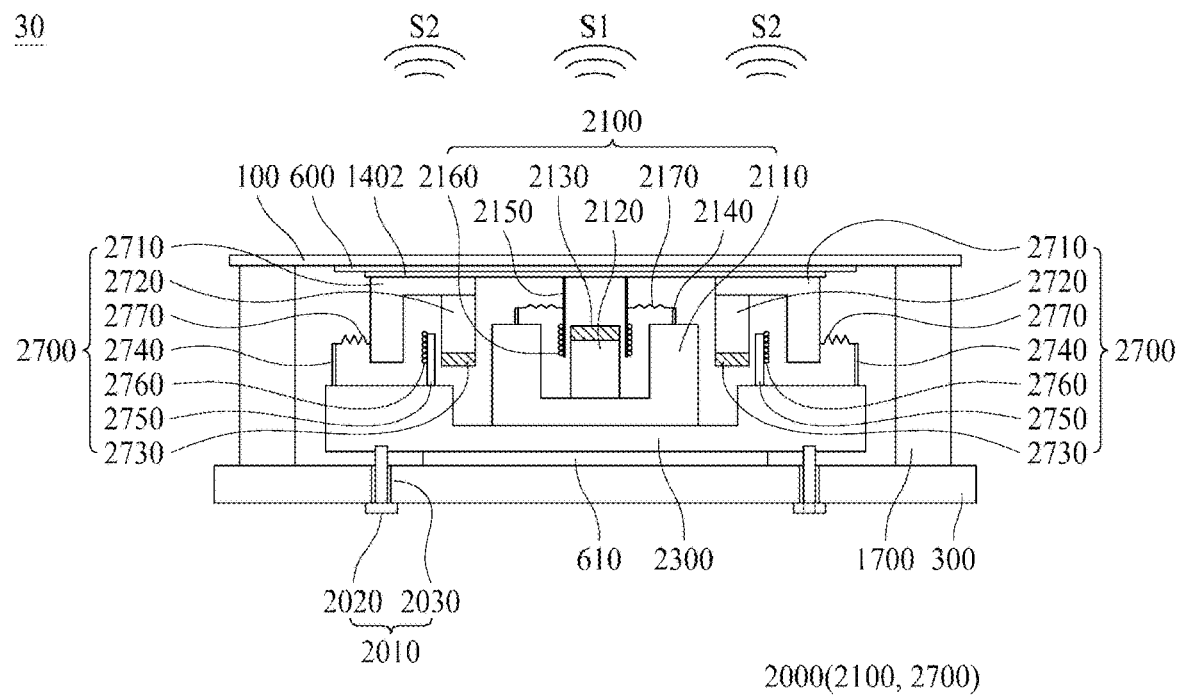
FIG. 10 illustrates a display apparatus including the vibration generating device according to another embodiment of the present disclosure.

FIG. 10 illustrates a display apparatus including the vibration generating device according to another embodiment of the present disclosure.

With reference to FIG. 10, the display apparatus 30 according to another embodiment of the present disclosure may comprise a display panel 100 and a vibration generating device 2000. On the rear surface of the display panel 100, an encapsulation plate may be disposed as illustrated in FIG. 6. For example, the encapsulation substrate may protect a thin film transistor and an emission element layer disposed on the display panel 100 from the external impacts, and may prevent the moisture or oxygen from penetrating into the emission element layer.

The display apparatus 30 according to another embodiment of the present disclosure may comprise a supporting member 300 disposed at the rear surface of the display panel 100 and configured to support the display panel 100. A partition 1700 may be disposed between the display panel 100 and the supporting member 300.

The vibration generating device 2000 according to another embodiment of the present disclosure may comprise a first sound generating device 2100 and a second sound generating device 2700. For example, the second sound generating device 2700 may be disposed around the first sound generating device 2100.

The first sound generating device 2100 may output sound having different sound bandwidth (or range) from the second sound generating device 2700. For example, the first sound generating device 2100 may output a first sound S1. The second sound generating device 2700 may output a second sound S2. The first sound S1 may be a high-pitched sound band, and the second sound S2 may be a low-pitched sound band. For example, the second sound generating device 2700 may be provided for supplementing the low-pitched sound band of the first sound generating device 2100. For example, the high-pitched sound band may be 3 kHz or more, and the low-pitched sound band may be 200 Hz or less, but embodiments are not limited thereto.

The first sound generating device 2100 and the second sound generating device 2700 may be simultaneously operated by receiving a vibration signal, but embodiments are not limited thereto.

The vibration generating device 2000 may be disposed on a frame body 2300. For example, the first sound generating device 2100 and the second sound generating device 2700 may be disposed on the frame body 2300. In the case that the first sound generating device 2100 and the second sound generating device 2700 are assembled after each of them is configured respectively, the vibration of the first sound generating device 2100 may be different from the vibration of the second sound generating device 2700, so that an eccentric vibration (or a horizontal vibration) may be occurred. Accordingly, a problem that a desired sound may not be generated may occur. The first sound generating device 2100 and the second sound generating device 2700 are disposed on one frame body 2300 without any additional structure for disposing the first and second sound generating devices 2100 and 2700. Therefore, the assembling process may be simplified and there is no the eccentric vibration (or horizontal vibration), and the excellent sound quality may be acquired. In the embodiments of the present disclosure, any of a sound generating device having the first structure and a sound generating device having the second structure may be applied. Hereinafter, a sound generating device having the second structure will be described as an example.

The first sound generating device 2100 may include a yoke 2110 disposed on the frame body 2300, a magnet 2120 on the yoke 2110, a center pole 2130 on the magnet 2120, a bobbin 2150 around the magnet 2120, and a coil 2160 around the bobbin 2150. A frame 2140 may be disposed at one portion of the yoke 2110. A damper 2170 may be disposed between the yoke 2110 and the bobbin 2150. For example, the damper 2170 may be disposed between the bobbin 2150 and the frame 2140. For example, the damper 2170 may be disposed between some portion of an upper portion of the bobbin 2150 and the frame 2140. The yoke 2110 may be a plate, but embodiments are not limited the terms. The coil 2160 may be a voice coil, but embodiments are not limited the terms. The damper 2170 may be referred to as a spider, a suspension, or an edge, but embodiments are not limited thereto.

The detailed description of the first sound generating device may be similar to descriptions given above with reference to FIGS. 2 to 6, and thus, their detailed descriptions are omitted.

When the coil 2160 is wound to surround an outer circumference surface of the bobbin 2150, heat occurring in the coil 2160 may be transferred to the bobbin 2150, and the coil 2160 may include a material which is relatively good in heat dissipation characteristic, for decreasing image quality defect affecting the display panel 100 due to the heat of the bobbin 2150. Since the bobbin 2150 vibrates upward and downward, an eccentric vibration (or a horizontal vibration) may occur due to a vertical vibration, and the eccentric vibration of the bobbin 2150 may be affected by a weight of the bobbin 2150. A weight of the bobbin 2150 may be affected by a weight of the coil 2160. Accordingly, when a weight of the coil 2160 is reduced, the eccentric vibration of the bobbin 2150 may decrease. Thus, considering heat transferred to the bobbin 2150 and the eccentric vibration of the bobbin 2150, the coil 2160 may have a relatively good heat dissipation characteristic because thermal conductivity thereof is better than that of copper which is a material of a general coil, and may include an Al material which has a relatively good heat dissipation characteristic and us relatively lightweight compared to copper.

Moreover, in aluminum, since oxide is formed in air, welding may be not easy in manufacturing the first sound generating device 2100. Therefore, the coil 2160 according to another embodiment of the present disclosure may include an aluminum layer (or a first metal layer) for dissipating heat and a metal covering layer (or a second metal layer) surrounding the aluminum layer. The metal covering layer may include one of copper (Cu), silver (Ag), and gold (Au). For example, the coil 2160 may be a copper clad aluminum wire is covered by copper. The metal covering layer may be formed as a thin film type outside the first metal layer, and thus, may not greatly affect an increase in weight of the coil 2160. Accordingly, a weight of the coil 2160 according to another embodiment of the present disclosure may decrease by about 60% compared to a coil including only copper material or copper wire.

For example, the bobbin 2150 may include a structure including a material obtained by processing pulp or paper, aluminum or magnesium, or an alloy thereof, or a synthetic resin such as polyimide. For example, the bobbin 2150 may be implemented with a polyimide film which is relatively good heat dissipation characteristic and is relatively lightweight, for preventing an image quality defect of the display panel 100 caused by heat occurring in the coil 2160. The polyimide film may have physical properties which are not changed within a wide temperature range from −273° C. to 400° C. and may have a heat resistance, electrical insulation, flexibility, and nonflammable. Also, since the polyimide film is good in thermal and mechanical strength, the polyimide film may enhance the reliability of the bobbin 2150, the polyimide film may enhance the reliability of the bobbin 1650, and the occurrence of heat caused by a vibration of the bobbin 1650 may be reduced based on an excellent heat dissipation characteristic. For example, the polyimide film may be KAPTON and may be a condensation of pyromellitec dianhydride and 4,4'-oxydianiline.

For example, as explained with FIG. 6, a bobbin ring may be further provided on the bobbin 2150. The bobbin ring 2150 may be disposed between the bobbin 2150 and the display panel 100 and may transfer a vibration of the bobbin 2150 to the display panel 100. The bobbin ring may be disposed at a whole portion of the bobbin 2150, but embodiments are not limited thereto. For example, bobbin ring may be disposed at a position at which the bobbin 2150 is disposed. The bobbin ring may be attached or connected on the display panel 100 by an adhesive member. The adhesive member may include a double-sided tape, a single-sided tape, an adhesive agent, or glue agent (or bond), but embodiments are not limited thereto.

For the first sound generating device 2100, as the current is applied to the coil 2160, a magnetic field is generated around the coil 2160. Since an external magnetic field is generated by the magnet 2120, the bobbin 2150 may be guided by the center pole 2130 and move to upper portion according to Fleming's Left-Hand Rule for Motors. Therefore, the bobbin 2150 may vibrate the display panel 100 in an upward direction according to a current is applied to the coil or not, and a sound wave (or sound) may be generated by the vibration of the display panel 100. In this state, when the application of the current stops or is applied, the bobbin 2150 may vibrate to an upper portion of the display panel 100. Then, the sound (or acoustic wave) may be generated by the vibration of the display panel 100 and output sound toward a front of the display panel 100. As the first sound generating device 2100 may generate the sound by vibrating the display panel 100 according to the vibration of the coil 2160 or the voice coil, the first sound generating device 2100 may be referred to as a vibration coil device or a voice coil sound generator, but embodiments are not limited thereto. The sound generated from the first sound generating device 2100 may be the first sound S1. For example, the first sound generating device 2100 may be configured with a vibration coil device or a voice coil device for outputting the first sound S1. For example, the first sound S1 may be a sound of a high-pitched sound band.

The second sound generating device 2700 may include a bobbin 2750 disposed on the frame body 2300, a coil 2760 disposed around the bobbin 2750, a yoke 2710 disposed on the rear surface of the display panel 100, a magnet 2720 disposed on the yoke 2710, and a center pole 2730 disposed on the magnet 2720. For example, the bobbin 2750 and the coil 2760 may be disposed between the magnet 2720 and the yoke 2710. For example, the magnet 2720 may be disposed at one portion of the yoke 2710. A damper 2770 may be disposed at the other portion of the yoke 2710. The damper 2770 may be disposed between the other portion of the yoke 2710 and the frame 2740 on the frame body 2300. The yoke 2710 may be a plate, but embodiments are not limited thereto. The damper 2770 may be referred to as other terms such as a spider, a suspension, or an edge, but embodiments are not limited thereto.

The second sound generating device 2700 may vibrate the display panel 100 by the vibration of the magnet 2720. As the sound (or acoustic wave) may be generated by the vibration of the display panel 100, the sound may be output to the front direction of the display panel 100. The second sound generating device 2700 may be referred to as a vibrating magnetic device or a magnetic circuit sound generating device, but embodiments are not limited thereto. The sound generated from the second sound generating device 2700 may be a second sound S2. For example, the second sound S2 may be different from the first sound S1. For example, the second sound S2 may be a sound of a low-pitched sound band. The second sound generating device 2700 may supplement the low-pitched sound band of the first sound generating device 2100.

The first sound generating device 2100 and the second sound generating device 2700 according to another embodiment of the present disclosure may include at least one of an oval sound generating device, a pair of sound generating device and a circular sound generating device. The oval shape may include an elliptical shape, a rectangular (e.g., quadrilateral) shape with rounded corners, or a non-circular curved shape having a width different from its height, but embodiments are not limited thereto. For example, in the bobbin of the oval shape, a ratio of long-axis diameter to a short-axis diameter may be in the range of 1.3:1~2:1. The bobbin of oval shape may more improve a sound of the high-pitched sound band than a circular shape, and may decrease the occurrence of heat caused by a vibration, and thus, may have excellent heat dissipation characteristic. For example, at least one sound generating device may generate a sound by vibrating the display panel directly.

For example, the first sound generating device 2100 may be disposed on the supporting member 300. In the case that the yoke 2110 of the first sound generating device 2100 is disposed on the supporting member 300, it may be expressed that the first sound generating device 2100 is installed in a forward direction. The first sound generating device 2100 may output a sound of high-pitched sound band.

For example, the second sound generating device 2700 may be disposed at the rear surface of the display panel 100. In the case that the yoke 2710 of the second sound generating device 2700 is disposed on the opposite portion of the supporting member 300, it may be expressed that the second sound generating device 2700 is installed in a reverse direction or reversely disposed. The second sound generating device 2700 may output a sound of low-pitched sound band. As the second sound generating device 2700 may compensate for the low-pitched sound band that is insufficient in the first sound generating device 2100, the vibration generating device 2000 according to another embodiment of the present disclosure may output sound of a high-pitched sound band to a low-pitched sound band For example, the first sound generating device 2100 and the second generating device 2700 may be disposed at a same axis. For example, the first sound generating device 2100 and the second generating device 2700 may be a coaxial sound generating device that disposed at a same axis For example, the first sound generating device 2100 for generating a high-pitched sound band and the second generating device 2700 for generating a low-pitched sound band may be disposed at the same axis, which may be referred to as a coaxial sound generating device. Therefore, the sound of the same phase may be reproduced by the first sound generating device 2100 outputting the high-pitched sound band and the second sound generating device 2700 outputting the low-pitched sound band. A vibration generating device 200 with a wide sound field effect may be implemented.

The vibration generating devices 2000 according to another embodiment of the present disclosure may share the display panel 100 as a vibration plate. For example, the first sound generating device 2100 and the second sound generating device 2700 may be disposed as sharing the display panel 100. For example, the vibration generating device 2000 may be a hybrid vibration generating device or a 2-way vibration generating device in which two different sound generating devices are disposed.

To reduce the heat generated by the vibration of the vibration generating device 2000, a first heat dissipation member 600 may be further disposed on the rear surface of the display panel 100. For example, the first dissipation member 600 may be attached on the rear surface of the display panel by an adhesive member. The adhesive member may include a double-sided tape, a single-sided tape, an adhesive agent or a glue agent, but embodiments are not limited thereto. The first heat dissipation member 600 may have larger size than the vibration generating device 2000 or may be configured to cover the vibration generating device 2000, but embodiments are limited thereto. The first heat dissipation member 600 may be a polygonal plate or circular plate having a certain thickness, but embodiments are not limited thereto. For example, the first heat dissipation member 600 may be formed of metal material having high thermal conductivity such as aluminum (Al), copper (Cu), silver (Ag) or alloy thereof, but embodiments are not limited thereto. The first heat dissipation member 600 may be referred to as a heat dissipation sheet, a heat dissipation tape, or a heat dissipation pad, but embodiments are not limited thereto. With the first heat dissipation member 600, the effect on the image quality of the display panel 100 due to heat generated during vibration of the vibration generating device 2000 may be reduced.

As explained with FIG. 6, in the case that the encapsulation substrate is provided on the rear surface of the display panel 100, the first dissipation member 600 may be attached at the rear surface of the encapsulation substrate by the adhesive member. In this case, the adhesive member may be disposed between the encapsulation substrate and the first dissipation member 600. For example, the adhesive member may include a double-sided tape, a single-sided tape, an adhesive agent or a glue agent (or bond), but embodiments are not limited thereto.

In another embodiment of the present disclosure, the display apparatus 30 may further include a second heat dissipation member 610 on the rear surface of the vibration generating device 2000. For example, the second dissipation member 610 may be disposed between the vibration generating device 2000 and the supporting member 300. For example, the second heat dissipation member 610 may be formed of metal material having high thermal conductivity such as aluminum (Al), copper (Cu), silver (Ag) or alloy thereof, but embodiments are not limited thereto. The second heat dissipation member 610 may be referred to as a heat dissipation sheet, a heat dissipation tape or a heat dissipation pad, but embodiments are limited thereto. Because the second heat dissipation member 610 is provided, an influence of heat occurring when the sound generating device 2000 is vibrating may be reduced on the image quality of the display panel 100.

The vibration generating device 2000 may be attached on the display panel 100 using an adhesive member 1402. The first sound generating device 2100 and the second sound generating device 2700 may be attached or disposed on the display panel 100 using the adhesive member 1402. For example, the first sound generating device 2100 and the second sound generating device 2700 may be attached or disposed on the rear surface of the display panel 100 using the adhesive member 1402.

In another embodiment of the present disclosure, the display apparatus 30 may further include a connection member 2010. The connection member 2010 may be applied for connecting the vibration generating device 2000 to the supporting member 300. The connection member 2010 may include a screw 2020 and a nut 2030. The screw 2020 and the nut 2030 may be disposed at the supporting member 300, and the vibration generating device 2000 may be disposed between the supporting member 300 and the display panel 100 by the screw 2020 and the nut 2030. For example, the nut 2030 may be a self-clinching nut. An example of the self-clinching nut may include a PEM® nut, but embodiments are not limited thereto. If the PEM nut is used, some of the vibration generated in the vibration generation device 2000 may be absorbed by the PEM nut. Thus, a vibration transferred to the supporting member 300 may be reduced.

The vibration generating device 2000 may be disposed as shown in FIG. 6. A third heat dissipation member may be further disposed on the rear surface of the vibration generating device 2000. For example, the screw 2020 and the nut 2030 may be disposed in the frame body 2300, and the third dissipation member may be connected to the vibration generating device 2000 by the screw 2020 and the nut 2030.

Figure 11:
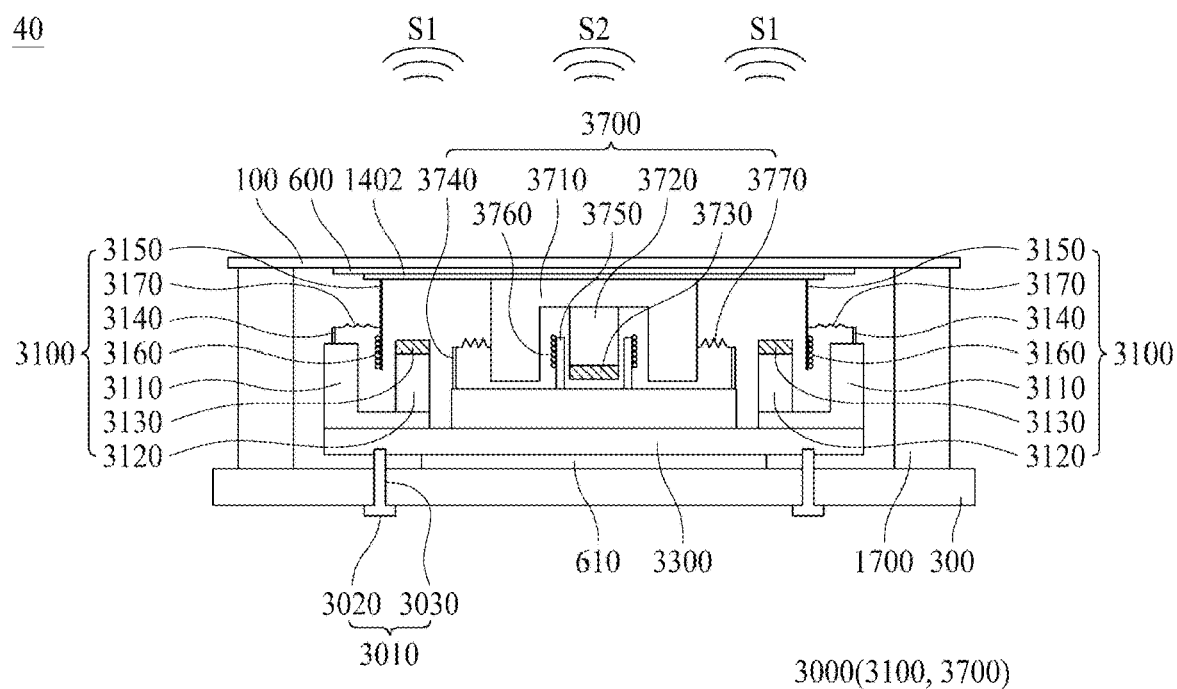
FIG. 11 illustrates a display apparatus including the vibration generating device according to another embodiment of the present disclosure.

FIG. 11 illustrates a display apparatus including the vibration generating device according to another embodiment of the present disclosure.

With reference to FIG. 11, a display apparatus 40 according to another embodiment of the present disclosure may comprises a display panel 100 and a vibration generating device 3000. An encapsulation substrate may be disposed on the rear surface of the display panel 100 as illustrated in FIG.

6. For example, the encapsulation substrate may protect the thin film transistor and the emission element layer disposed on the display panel 100 from an external impact, and may prevent moisture (or water) or oxygen from penetrating into the emission element layer.

The display apparatus 40 according to another embodiment of the present disclosure may include a supporting member 300 at the rear surface of the display panel 100 and supporting the display panel 100. A partition 1700 may be disposed between the display panel 100 and the supporting member 300.

The vibration generating device 3000 according to another embodiment of the present disclosure may include a first sound generating device 3100 and a second generating device 3700. For example, the first sound generating device 3100 may be disposed around or near the second sound generating device 3700.

The first sound generating device 3100 may output a sound having different sound band from the second sound generating device 3700. For example, the first sound generating device 3100 may output a first sound S1. The second sound generating device 3700 may output a second sound S2. The first sound may be a high-pitched sound band, and the second sound may be the low-pitched sound band. For example, the second sound generating device 3700 may supplement the sound of the low-pitched sound band of the first sound generating device 3100. For example, the high-pitched sound band may refer to a frequency range of 3 kHz or more, and the low-pitched sound band may refer to a frequency range of 200 Hz or less, but embodiments are not limited thereto.

The first sound generating device 3100 and the second sound generating device 3700 may receive the vibration signal and be operated at the same time, but embodiments are not limited thereto.

The vibration generating device 300 may be disposed on a frame body 3300. For example, the first sound generating device 3100 and the second sound generating device 3700 may be installed on the frame body 3300. In the case that the first sound generating device 3100 and the second sound generating device 3700 are assembled after each of them is configured respectively, the vibration of the first sound generating device 3100 may be different from the vibration of the first sound generating device 3700, so that and eccentric vibration (or a horizontal vibration) may be occurred. Accordingly, distorted problem that a desired sound may not be generated may occur. The first sound generating device 3100 and the second sound generating device 3700 are disposed on one frame body 3300 without any additional structure for disposing the first and second sound generating device 3100 and 3700. Therefore, the assembling process may be simplified and there is no eccentric vibration (or horizontal vibration), and the excellent sound quality may be acquired.

In the embodiments of the present disclosure, any of a sound generating device having the first structure and a sound generating device having the second structure may be applied. Hereinafter, a sound generating device having the second structure will be described as an example.

The first sound generating device 3100 may include a yoke 3110 disposed on the frame body 3300, a magnet 3120 on the yoke 3110, a center pole 3130 on the magnet 3120, a bobbin 3150 around the magnet 3120, and a coil 3160 around the bobbin 3150. For example, the bobbin 3150 and the coil 3160 may be disposed between the magnet 3120 and the yoke 3110. A frame 3140 may be disposed at one portion of the yoke 3110. A damper 3170 may be disposed between the yoke 3110 and the bobbin 3150. For example, the damper 3170 may be disposed between the bobbin 3150 and the frame 3140. For example, the damper 3170 may be disposed between some portions of an upper portion of the bobbin 3150 and the frame 3140. The yoke 3110 may be a plate, but embodiments are not limited thereto. The coil 3160 may be a voice coil, but embodiments are not limited thereto. The damper 3170 may be referred to as a spider, a suspension or an edge, but embodiments are not limited thereto.

The detailed description of the first sound generating device may be similar to descriptions given above with reference to FIGS. 2 to 6 and 10, and thus, their detailed descriptions are omitted. The detailed description of the coil and bobbin ring may be similar to descriptions given with reference to FIG. 10, so their detailed descriptions are omitted.

For the first sound generating device 3100, as the current is applied to the coil 3160, a magnetic field is generated around the coil 3160. Since an external magnetic field is generated by the magnet 3120, the bobbin 3150 may be guided by the center pole 2130 and move to upper portion according to Fleming's Left-Hand Rule for Motors. Therefore, the bobbin 3150 may vibrate the display panel 100 in an upward direction according to a current is applied to the coil or not, and a sound wave (or sound) may be generated by the vibration of the display panel 100. In this state, when the application of the current tops or is applied the bobbin 3150 may vibrate to an upper portion of the display panel 100. Then, the sound (or acoustic wave) may be generated by the vibration of the display panel 100 and output sound toward a front of the display panel 100. As the first sound generating device 3100 may generate the sound by vibrating the display panel 100 according to the vibration of the coil 3160 or the voice coil, the first sound generating device 3100 may be referred to as a vibration coil device or a voice coil sound generator, but embodiments are not limited thereto. The sound generated from the first sound generating device 3100 may be the first sound S1. For example, the first sound generating device 3100 may be configured with a vibration coil device or a voice coil device for outputting the first sound S1. For example, the first sound S1 may be the high-pitched sound band.

The second sound generating device 3700 may include a bobbin 3750 disposed on the frame body 3300, a coil 3760 disposed around the bobbin 3750, a yoke 3710 disposed on the rear surface of the display panel 100, a magnet 3720 disposed on the yoke 3710, and a center pole 3730 disposed on the magnet 3720. For example, the bobbin 3750 and the coil 3760 may be disposed between the magnet 3720 and the yoke 3710. For example, the magnet 3720 may be disposed at one portion of the yoke 3710. A damper 3770 may be disposed at the other portion of the yoke 2710. The damper 3770 may be disposed between the other portion of the yoke 3710 and the frame 3740 on the frame body 3300. The yoke 2710 may be a plate, but embodiments are not limited thereto. The damper 3770 may be referred to as other terms such as a spider, a suspension or an edge, but embodiments are not limited thereto.

The second sound generating device 3700 may vibrate the display panel 100 by the vibration of the magnet 3720. As the sound (or acoustic wave) may be generated by the vibration of the display panel 100, the sound may be output to the front direction of the display panel 100. The second sound generating device 3700 may be referred to as a vibrating magnetic device or a magnetic circuit sound generating device, but embodiments are not limited thereto. The sound generated from the second sound generating device 3700 may be a second sound S2. For example, the second sound S2 may be different from the first sound S1. For example, the second sound S2 may be the sound in the low-pitched sound band. The second sound generating device 2700 may supplement the low-pitched sound band of the first sound generating device 3100.

The first sound generating device 3100 and the second sound generating device 3700 according to another embodiment of the present disclosure may include at least one of an oval sound generating device, a pair of sound generating device and a circular sound generating device. The oval shape may include an elliptical shape, a rectangular (e.g., quadrilateral) shape with rounded corners, or a non-circular curved shape having a width different from its height, but embodiments are not limited thereto. For example, in the bobbin of the oval shape, a ratio of long-axis diameter to a short-axis diameter may be in the range of 1.3:1~2:1. The bobbin of oval shape may more improve a sound of the high-pitched sound band than a circular shape, and may decrease the occurrence of heat caused by a vibration, and thus, may have excellent heat dissipation characteristic. For example, at least one sound generating device may directly vibrate the display panel to generate a sound.

For example, the first sound generating device 3100 may be disposed on the supporting member 300. In the case that the yoke 3110 of the first sound generating device 3100 is disposed on the supporting member 300, it may be expressed that the first sound generating device 3100 is installed in a forward direction. The first sound generating device 3100 may output a sound of high-pitched sound band.

For example, the second sound generating device 3700 may be disposed at the rear surface of the display panel 100. In the case that the yoke 3710 of the second sound generating device 3700 is disposed on the opposite portion of the supporting member 300, it may be expressed that the second sound generating device 3700 is installed in a reverse direction or reversely disposed. The second sound generating device 3700 may output a sound of low-pitched sound band. As the second sound generating device 3700 may compensate for the low-pitched sound band that is insufficient in the first sound generating device 3100, the vibration generating device 3000 according to another embodiment of the present disclosure may output sound of a high-pitched sound band to a low-pitched sound band.

The vibration generating devices 3000 according to the present disclosure may share the display panel 100 as a vibration plate. For example, the first sound generating device 3100 and the second sound generating device 3700 may be disposed as sharing the display panel 100. For example, the vibration generating device 3000 may be a hybrid vibration generating device or a 2-way vibration generating device in which two different sound generating devices are disposed.

To reduce the heat generated by the vibration of the vibration generating device 3000, a first heat dissipation member 600 may be further disposed on the rear surface of the display panel 100. For example, the first dissipation member 600 may be attached on the rear surface of the display panel by an adhesive member. The adhesive member may include a double-sided tape, a single-sided tape, an adhesive agent or a glue agent, but embodiments are not limited thereto. The first heat dissipation member 600 may have larger size than the vibration generating device 3000 or may be configured to cover the vibration generating device 3000, but embodiments are limited thereto. The first heat dissipation member 600 may be a polygonal plate or a circular plate having a certain thickness, but embodiments are not limited thereto. For example, the first heat dissipation member 600 may be formed of metal material having high thermal conductivity such as aluminum (Al), copper (Cu), silver (Ag) or alloy thereof, but embodiments are not limited thereto. The first heat dissipation member 600 may be referred to as a heat dissipation sheet, a heat dissipation tape or a heat dissipation pad, but embodiments are not limited thereto. Because the first heat dissipation member 600 is provided, an influence of heat occurring when the sound generating device 3000 is vibrating may be reduced on the image quality of the display panel 100.

As explained with FIG. 6, in the case that the encapsulation substrate is provided on the rear surface of the display panel 100, the first dissipation member 600 may be attached at the rear surface of the encapsulation substrate by an adhesive member. In this case, the adhesive member may be disposed between the encapsulation substrate and the first dissipation member 600. For example, the adhesive member may include a double-sided tape, a single-sided tape, an adhesive agent or a glue agent (or bond), but embodiments are not limited thereto.

In another embodiment of the present disclosure, the display apparatus 40 may further include a second heat dissipation member 610 on the rear surface of the vibration generating device 3000. For example, the second dissipation member 610 may be disposed between the vibration generating device 3000 and the supporting member 300. For example, the second heat dissipation member 610 may be formed of metal material having high thermal conductivity such as aluminum (Al), copper (Cu), silver (Ag) or alloy thereof, but embodiments are not limited thereto. The second heat dissipation member 610 may be referred to as a heat dissipation sheet, a heat dissipation tape, or a heat dissipation pad, but embodiments are not limited thereto. If the second heat dissipation member 610 is provided, an influence of heat occurring when the sound generating device 3000 is vibrating may be reduced on the image quality of the display panel 100.

The vibration generating device 3000 may be attached on the display panel 100 using an adhesive member 1402. The first sound generating device 3100 and the second sound generating device 3700 may be disposed on the display panel 100 using the adhesive member 1402. For example, the first sound generating device 3100 and the second sound generating device 3700 may be disposed on the rear surface of the display panel 100 using the adhesive member 1402.

In another embodiment of the present disclosure, the display apparatus 40 may further include a connection member 3010. The connection member 3010 may be applied for connecting the vibration generating device 3000 to the supporting member 300. The connection member 3010 may include a screw 3020 and a nut 3030. The screw 3020 and the nut 3030 may be disposed at the supporting member 300, and the vibration generating device 3000 may be disposed between the supporting member 300 and the display panel 100 by the screw 3020 and the nut 3030. For example, the nut 3030 may be a self-clinching nut. An example of the self-clinching nut may include a PEM® nut, but embodiments are not limited thereto. If the PEM nut is used, some of the vibration generated in the vibration generation device 3000 may be absorbed by the PEM nut. Thus, a vibration transferred to the supporting member 300 may be reduced.

The vibration generating device 3000 may be disposed as shown in FIG. 6. A third heat dissipation member may be further disposed on the rear surface of the vibration generating device 3000. For example, the screw 3020 and the nut 3030 may be disposed in the frame body 3300, and the third dissipation member may be connected to the vibration generating device 3000 by the screw 3020 and the nut 3030.

FIGS. 12A to 12D illustrate an embodiment of a vibration generating device and a partition according to another embodiment of the present disclosure.

With reference to FIGS. 12A to 12D, the display panel 100 may include a first area L and a second area R. The first area L may refer to the left area of the rear surface of the display panel 100, and the second area R may refer to the right area of the rear surface of the display panel 100. The vibration generating device 2000 may include a first vibration generating device 2000-1 and a second vibration generating device 2000-2. Each of the first vibration generating device 2000-1 and the second vibration generating device 2000-2 may include a first sound generating device 2100 and a second sound generating device 2700. The first vibration generating device 2000-1 may be disposed at the first area L on the rear surface of the display panel 100, and the second vibration generating device 2000-2 may be disposed at the second area R on the rear surface of the display panel 100. The first vibration generating device 2000-1 and the second vibration generating device 2000-2 may be configured as explained with FIGS. 10 and 11. In FIGS. 12A to 12D, the vibration generating device in FIG. 10 is used for explanation, and the vibration generating device shown in FIG. 11 may be also used.

The first vibration generating device 2000-1 may be disposed at the first area L as the left area of the rear surface of the display panel 100 and configured to vibrate the first area L of the display panel 100. The second vibration generating device 2000-2 may be disposed at the second area R as the right area of the rear surface of the display panel 100 and configured to vibrate the second area R of the display panel 100. Each of the first vibration generating device 2000-1 and the second vibration generating device 2000-2 may receive the vibration signal different each other, and may operate independently. For example, the first vibration generating device 2000-1 may generate sound using the first area L (the left area) of the display panel 100 as a vibration plate, and the second vibration generating device 2000-2 may generate sound using the second area R (the right area) of the display panel 100 as a vibration plate. This explanation may be also applied to the explanation in FIGS. 13A to 13D.

A first partition 1700-1 disposed around the first vibration generating device 2000-1 and a second partition 1700-2 disposed around the second vibration generating device 2000-2 may be configured. The first partition 1700-1 and the second partition 1700-2 may be disposed between the display panel 100 and the supporting member 300. For example, the first partition 1700-1 and the second partition 1700-2 may be disposed between the rear surface of the display panel 100 and the upper surface or front surface of the supporting member 300. For example, the first partition 1700-1 and the second partition 1700-2 may be disposed on the rear surface of the display panel 100. For example, the first partition 1700-1 and the second partition 1700-2 may be disposed on the upper surface or front surface of the supporting member 300.

The partition may be an air gap or a space where a sound is generated when the display panel 100 vibrates. The partition may separate sounds or channels, and prevent or decrease the occurrence of a non-clear sound caused by sound interference. An air gap or a space which generates or transfers a sound may be referred to as a partition. The partition may be referred to as an enclosure or a baffle, but embodiments are not limited thereto. In the following embodiments, where the partition may be disposed at the supporting member as an example will be described, but embodiments are not limited thereto. For example, the partition may be disposed on the rear surface of the display panel. In explanation of embodiments, an example where the vibration generating device and the partition may be disposed on the supporting member will be described. For example, when the partition is disposed at the supporting member, an influence of the image quality of the display panel due to the partition disposed on the display panel may be reduced.

With reference to FIGS. 12A to 12D, at least one side of the first partition 1700-1 may include a bent portion. The bent portion may be disposed on one or more sides of the first partition 1700-1 where a strongest sound wave reaches among four sides of the first partition 1700-1. For example, a first bent portion 711 may be disposed at one side of the first partition 1700-1. A second bent portion 712 may be disposed at another side of the first partition 1700-1. For example, the second bent portion 712 may be disposed at the side opposition to the side where the first bent portion 711 is disposed. The first bent portion 711 and the second bent portion 712 may be configured with two straight-line portions. The first bent portion 711 and the second bent portion 712 may be provided at a position at which the two straight-line portions contact each other. The first bent portion 711 and the second bent portion 712 may be disposed toward the first vibration generating device 2000-1. The first bent portion 711 and the second bent portion 712 may be configured to face the first vibration generating device 2000-1 toward the first vibration generating device 2000-1. As the result, the first bent portion 711 and the second bent portion 712 may decrease a reduction in sound pressure caused by a standing wave which occurs due to interference between a reflected wave and a progressive wave of the first vibration generating device 2000-1.

At least one side of the second partition 1700-2 may include a bent portion. The bent portion may be placed on one or more sides of the second partition 1700-2 where a strongest sound wave reaches among four sides of the second partition 1700-2. For example, a third bent portion 713 may be disposed at one side of the second partition 1700-2. A fourth bent portion 714 may be disposed at another side of the second partition 1700-2. For example, the fourth bent portion 714 may be disposed at the side opposition to the side where the third bent portion 713 is disposed. Each of the third bent portion 713 and the fourth bent portion 714 may be configured with two straight-line portions. The third bent portion 713 and the fourth bent portion 714 may be provided at a position at which the two straight-line portions contact each other. The first bent portion 711 and the second bent portion 712 may be disposed toward the second vibration generating device 2000-2. The third bent portion 713 and the fourth bent portion 714 may be configured to face the second vibration generating device 2000-2 toward the second vibration generating device 2000-2. As the result, the third bent portion 713 and the fourth bent portion 714 may decrease a reduction in sound pressure caused by the standing wave which occurs due to interference between a reflected wave and a progressive wave of the second vibration generating device 2000-2.

The first partition 1700-1 and the second partition 1700-2 may be formed of at least one of a double-sided tape, a double-sided foam tape, a double-sided foam pad, a single-sided tape, a single-sided foam tape, a single-sided foam pad, a glue agent and bond agent, but embodiments are not limited thereto. In the case that the double-sided tape, the double-sided foam tape or the double-sided foam pad is used for configuring the partitions, an adhesive force between the rear surface of the display panel 100 and the supporting member 300 may be enhanced. For example, the first partition 1700-1 and the second partition 1700-2 may be formed of a material having an elasticity that may enable compression to be formed to some extent. For example, the first partition 1700-1 and the second partition 1700-2 may include one of polyurethane, polyolefin, and polyethylene, but embodiments are not limited thereto.

Figure 12A:
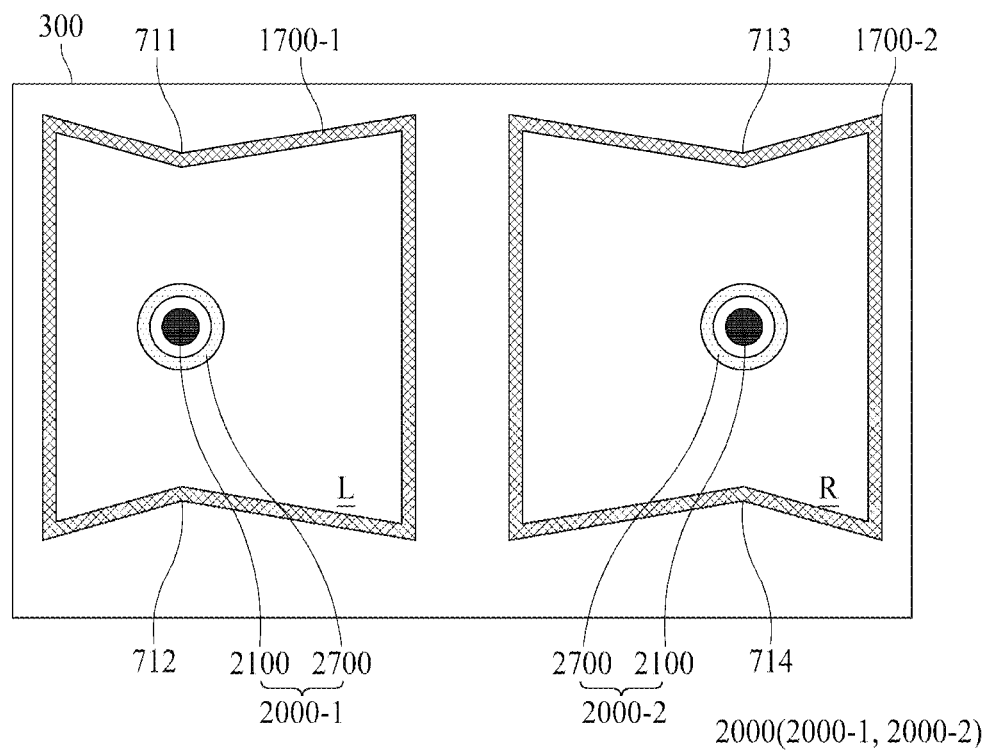
FIGS. 12A to 12D illustrate an embodiment of a vibration generating device and a partition according to another embodiment of the present disclosure.
Figure 12B:
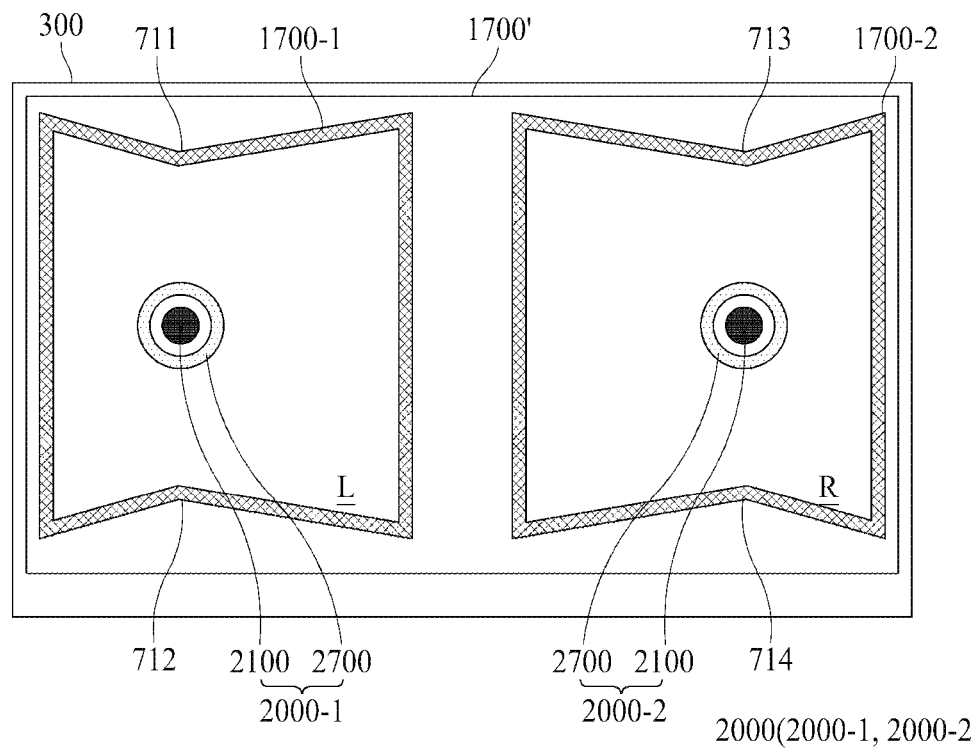

With reference to FIG. 12B, a third partition 1700' may be further disposed at an edge or periphery of the supporting member 300. The third partition 1700' may be disposed on the rear surface of the display panel 100 or on the upper surface or front surface of the supporting member 300. The third partition 1700' may be disposed at an edge or periphery on the rear surface of the display panel 100. Otherwise, the third partition 1700' may be disposed at the edge or periphery of the supporting member 300. The third partition 1700' may be disposed at the edge or periphery on the upper surface or front surface of the supporting member 300. The third partition 1700' may configure the air gap or the space for generating or propagating the sounds. The third partition 1700' may be an adhesive member for attaching the display panel 100 to the supporting member 300. The third partition 1700' may be omitted. The third partition 1700' may be formed of the same material with the first partition 1700-1 and the second partition 1700-2, but embodiments are not limited thereto. For example, the third partition 1700' may be formed of at least one of a double-sided tape, a double-sided foam tape, a double-sided foam pad, a single-sided tape, a single-sided foam tape, a single-sided foam pad, a glue agent and bond agent, but embodiments are not limited thereto. For example, the third partition 1700' may be formed of any one material of polyurethane, polyolefin, and polyethylene, but embodiments are not limited thereto. The configuration and the explanation of the third partition 1700' may be also applied to FIGS. 12C and 12D.

Figure 12C:
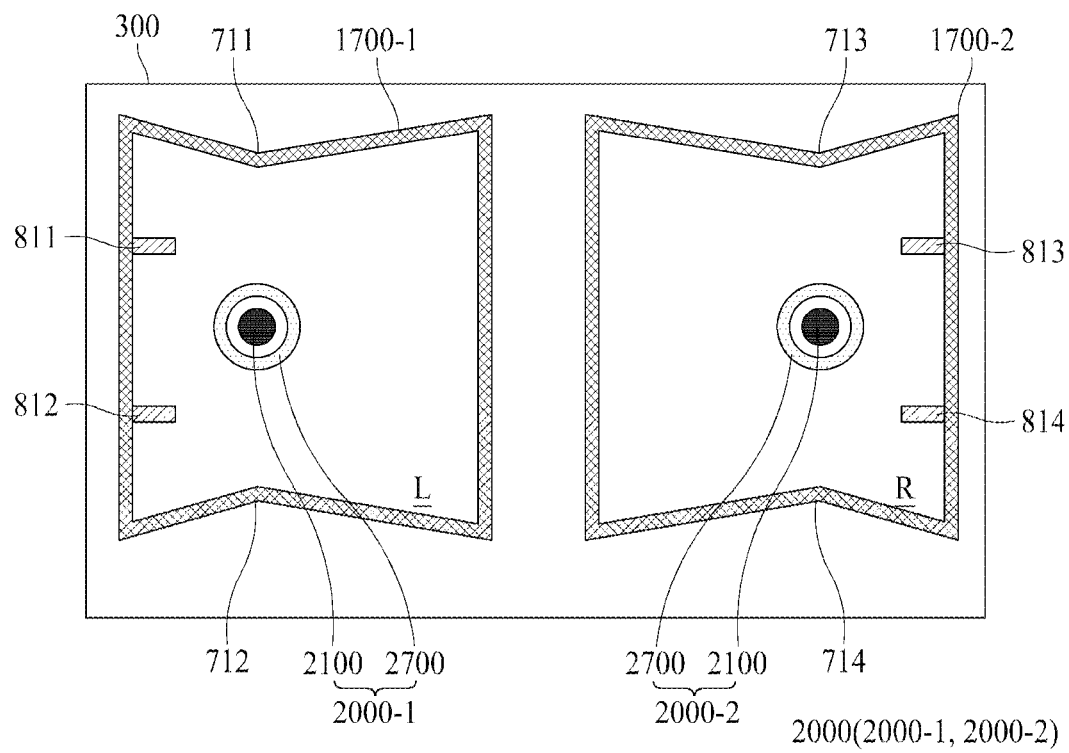

With reference to FIG. 12C, members 811 and 812 may be further disposed to at any one side of the first partition 1700-1. For example, a bent portion may be configured at one or more sides of the first partition 1700-1, and at least one or more members may be configured at another side perpendicular to the side where the bent portion is formed. For example, a first bent portion 711 and a second bent portion 712 are disposed at two sides of the first partition 1700-1 as facing each other, and at least one member may be configured at another side perpendicular to sides where the first bent portion 711 and the second bent portion 712 are formed. For example, the first partition 1700-1 may include a first side, a third side which is facing with the first side, and a second side which is perpendicular to the first side and the third side. The first bent portion 711 may be formed at the first side, and the second bent portion 712 may be formed at the third side. One or more members may be configured at the second side of the first partition 1700-1. The one or more members may include a first member 811 and a second member 812. The first bent portion 711 and the second bent portion 712 may be disposed toward the first vibration generating device 2000-1. The first bent portion 711 and the second bent portion 712 may be configured to face toward the first vibration generating device 2000-1. As the result, the first bent portion 711 and the second bent portion 712 may decrease a reduction in sound pressure caused by a standing wave which occurs due to interference between a reflected wave and a progressive wave of the first vibration generating device 2000-1. The first member 811 and the second member 812 may be disposed to face the first vibration generating device 2000-1 or to be toward the first vibration generating device 2000-1. The first member 811 and the second member 812 may further decrease a reduction in sound pressure caused by a standing wave which occurs due to interference between a reflected wave and a progressive wave of the first vibration generating device 2000-1. These members may be referred to as a sound pressure enhancing member or a vibration enhancing member, but embodiments are not limited thereto.

A third bent portion 713 and a fourth bent portion 714 are disposed at one or more sides of the second partition 1700-2, and at least one or more members may be configured at another side perpendicular to the side where the third bent portion 713 and the fourth bent portion 714 are formed. For example, the second partition 1700-2 may include a first side, a third side which is facing with the first side, and a second side which is perpendicular to the first side and the third side. The third bent portion 713 may be formed at the first side of the second partition 1700-2, and the fourth bent portion 714 may be formed at the third side of the second partition 1700-2. One or more members may be configured at the second side of the second partition 1700-2. The one or more members may include a third member 813 and a fourth member 814. The third bent portion 713 and the fourth bent portion 714 may be disposed toward the second vibration generating device 2000-2. The third bent portion 713 and the fourth bent portion 714 may be disposed as facing each other and being toward the second vibration generating device 2000-2. As the result, the third bent portion 713 and the fourth bent portion 714 may decrease a reduction in sound pressure caused by a standing wave which occurs due to interference between a reflected wave and a progressive wave of the second vibration generating device 2000-2. The third member 813 and the fourth member 814 may be disposed to face the second vibration generating device 2000-2 or to be toward the second vibration generating device 2000-2. The third member 813 and the fourth member 814 may further decrease a reduction in sound pressure caused by standing wave which occurs due to interference between a reflected wave and a progressive wave of the second vibration generating device 2000-2. These members may be referred to as a sound pressure enhancing member or a vibration enhancing member, but embodiments are not limited thereto.

For example, the first member 811 and the second member 812 may be disposed symmetrically with the third member 813 and the fourth member 814 with respect to the first vibration generating device 2000-1 or the second vibration generating device 2000-2. The first member 811 and the second additional member 812 may be disposed on the same line as the third member 813 and the fourth member 814 with respect to the first vibration generating device 2000-1 or the second vibration generating device 2000-2. Therefore, these members 811 to 814 may further decrease a reduction in sound pressure caused by a standing wave of the first vibration generating device 2000-1 or the second vibration generating device 2000-2.

The first member 811 and the second member 812 may be formed of the same material with the first partition 1700-1. For example, the first member 811 and the second member 812 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the first member 811 and the second member 812 may be formed of any one material of polyurethane, polyolefin, and polyethylene, but embodiments are not limited thereto.

The third member 813 and the fourth member 814 may be formed of the same material with the second partition 1700-2. For example, the third member 813 and the fourth member 814 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the third member 813 and the fourth member 814 may be formed of any one material of polyurethane, polyolefin, and polyethylene, but embodiments are not limited thereto.

The first to fourth members 811, 812, 813, and 814 may be formed of the same material with the first partition 1700-1 or the second partition 1700-2. For example, the first to fourth members 811, 812, 813, and 814 may be configured with at least one of a double-sided tape, a double-sided foam tape, a double-sided foam pad, a single-sided tape, a single-sided foam tape, a single-sided foam pad, a glue agent and bond agent, but embodiments are not limited thereto. For example, the first to fourth members 811, 812, 813, and 814 may be formed of any one material of polyurethane, polyolefin, and polyethylene, but embodiments are not limited thereto.

For example, the first to fourth members 811, 812, 813, and 814 may have a shape which may be implemented to prevent a peak or dip phenomenon caused by a standing wave of the vibration generating device 2000 to be easily controlled. For example, the first to fourth members 811, 812, 813 and 814 may have a rectangular (tetragonal, e.g., quadrilateral) shape or a rounded rectangular shape or a corner-rounded tetragonal shape. Here, the peak phenomenon refers to that a sound pressure bounces at a specific frequency, and the dip phenomenon refers to that the generation of specific frequency is suppressed so a low sound pressure is generated.

As the size of the first to fourth members 811, 812, 813, and 814 increases, it may be easier to control a peak or dip phenomenon caused by a standing wave. For example, when the widths of the first to fourth members 811, 812, 813, and 814 are less than 10 mm, it may be difficult to control a peak or dip phenomenon caused by the standing wave. Therefore, it is preferable that the widths of the first to fourth members 811, 812, 813, and 814 may be 10 mm or larger.

Figure 12D:
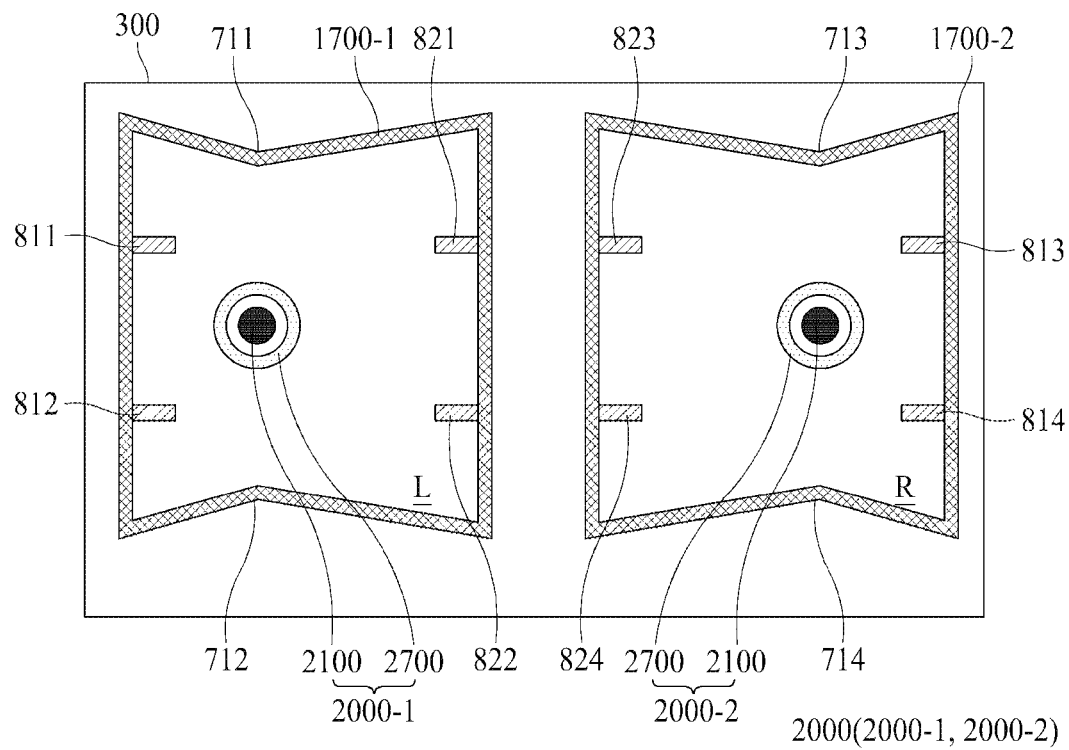

With reference to FIG. 12D, members may be further provided at another side of the first partition 1700-1. The same explanation with FIG. 12C may not be duplicated. For example, the first bent portion 711 may be configured at the first side of the first partition 1700-1, and the second bent portion 712 may be configured at the third side facing the first side of the first partition 1700-1. The first member 811 and the second member 812 may be configured at the second side of the first partition 1700-1. For example, a fifth member 821 and a sixth member 822 may be further configured to a fourth side facing with the second side of the first partition 1700-1. The fifth member 821 and the sixth member 822 may be further disposed the side which is facing with the first member 812 and the second member 812. The fifth member 821 and the sixth member 822 may be further disposed the side which is facing with the first partition 1700-1. The fifth member 821 and the sixth member 822 may be arranged as being toward the first vibration generating device 2000-1. Because the fifth member 821 and the sixth member 822 is provided, a reduction in sound pressure caused by a standing wave may be further decreased.

For example, the first member 811 and the second member 812 may be disposed symmetrically with the fifth member 821 and the sixth member 822 with respect to the first vibration generating device 2000-1. For example, the first member 811 and the second member 812 may be disposed on the same line as the fifth member 821 and the sixth member 822 with respect to the first vibration generating device 2000-1. Therefore, these members 821 and 822 may further decrease a reduction in sound pressure caused by a standing wave of the first vibration generating device 2000-1.

The fifth member 821 and the sixth member 822 may be formed of the same material with the first partition 1700-1. For example, the fifth member 821 and the sixth member 822 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the fifth member 821 and the sixth member 822 may be formed of any one material of polyurethane, polyolefin, and polyethylene, but embodiments are not limited thereto.

The fifth member 821 and the sixth member 822 may be formed of the same material with the first member 811 or the second member 812. For example, the fifth member 821 and the sixth member 822 may be configured with at least one of a double-sided tape, a double-sided foam tape, a double-sided foam pad, a single-side tape, a single-sided foam tape, a single-sided foam pad, a glue agent, and bond agent, but embodiments are not limited thereto. For example, the fifth member 821 and the sixth member 822 may be formed of any one material of polyurethane, polyolefin, and polyethylene, but embodiments are not limited thereto.

One or members may be further disposed to at any one side of the second partition 1700-2. The same explanation with FIG. 12C may not be duplicated. For example, the third bent portion 713 may be formed at the first side of the second partition 1700-2, and the fourth bent portion 714 may be formed at the third side of the second partition 1700-2. The third member 813 and the fourth member 814 may be configured at the second side of the second partition 1700-2. A seventh member 823 and an eighth member 824 may be configured at the fourth side of the second partition 1700-2. The seventh member 823 and the eighth member 824 may be further disposed the side which is facing with the third member 813 and the fourth member 814 For example, the seventh member 823 and the eighth member 824 may be disposed at the fourth side facing with the second side where the third member 813 and the fourth member 814 are disposed, in the second partition 1700-2. Because the seventh member 823 and the eighth member 824 is provided, a reduction in sound pressure caused by a standing wave may be further decreased.

For example, the seventh member 823 and the eighth member 824 may be disposed symmetrically with the third member 813 and the fourth member 814 with respect to the second vibration generating device 2000-2. For example, the third member 813 and the fourth member 814 may be disposed on the same line as the seventh member 823 and the eighth member 824 with respect to the second vibration generating device 2000-2. Therefore, these members 823 and 824 may further decrease a reduction in sound pressure reduction caused by a standing wave of the second vibration generating device 2000-2.

The seventh member 823 and the eighth member 824 may be formed of the same material with the second partition 1700-2. For example, the seventh member 823 and the eighth member 824 may be configured with at least one of a double-sided tape, a double-sided foam tape, a double-sided foam pad, a single-sided tape, a single-sided foam tape, a single-sided pad, a glue agent, and bond agent, but embodiments are not limited thereto. For example, the seventh member 823 and the eighth member 824 may be formed of any one material of polyurethane, polyolefin, and polyethylene, but embodiments are not limited thereto.

The seventh member 823 and the eighth member 824 may be formed of the same material with the third member 813 or the fourth member 814. For example, the seventh member 823 and the eighth member 824 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the seventh member 823 and the eighth member 824 may be formed of any one material of polyurethane, polyolefin, and polyethylene, but embodiments are not limited thereto.

Figure 13A:
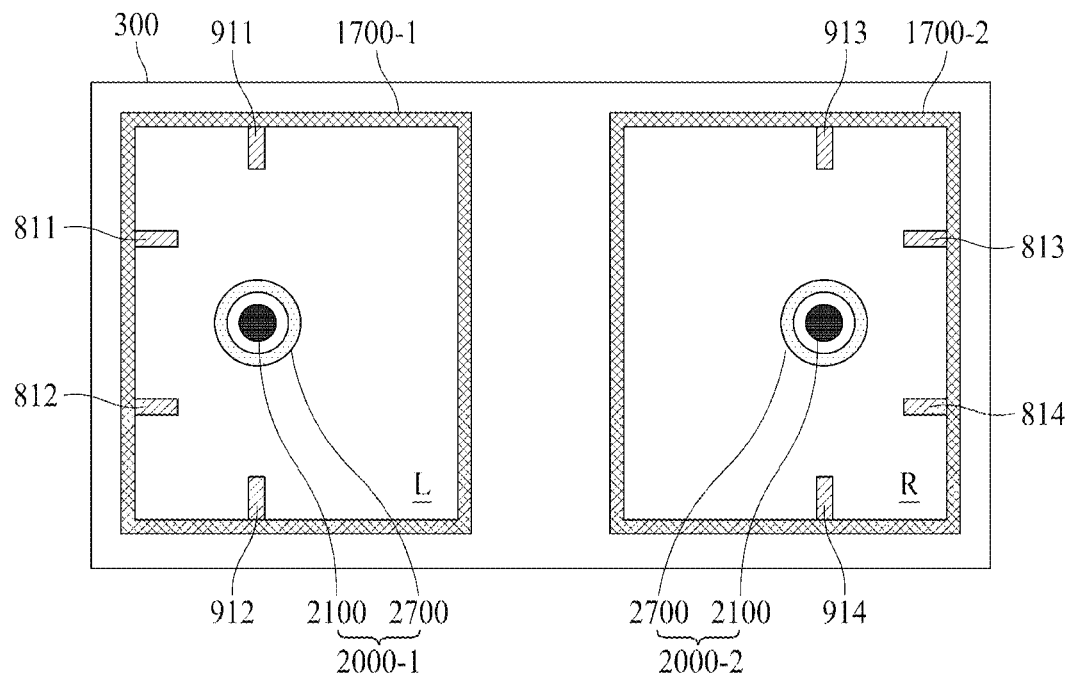
FIGS. 13A to 13C illustrate an embodiment of the vibration generating device and a partition according to another embodiment of the present disclosure.
Figure 13B:
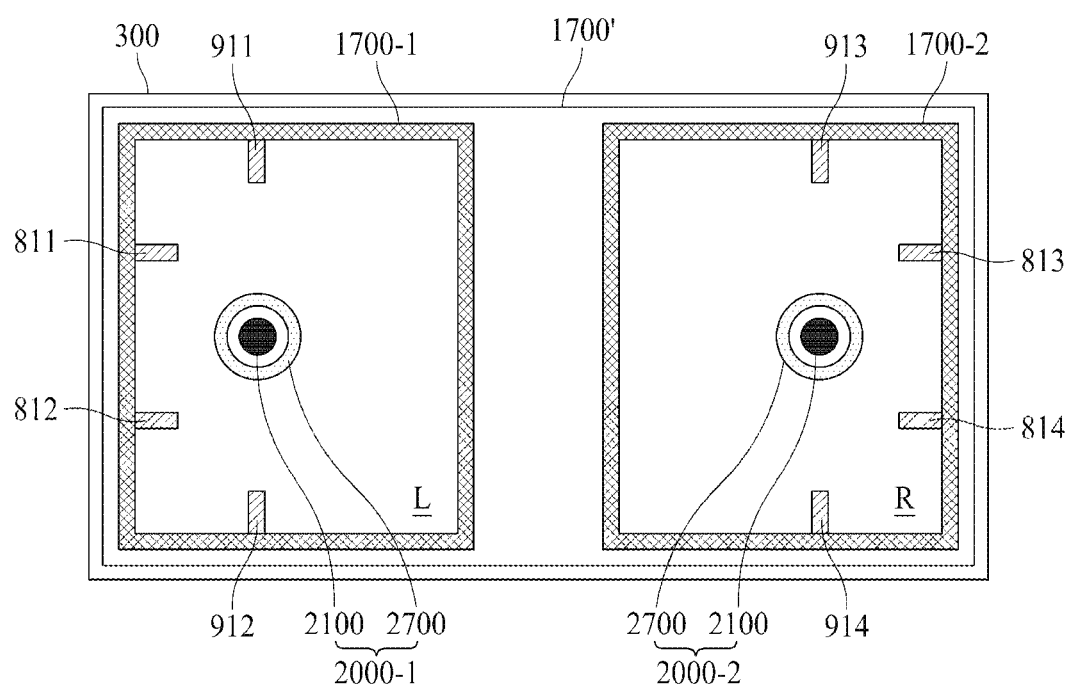
Figure 13C:
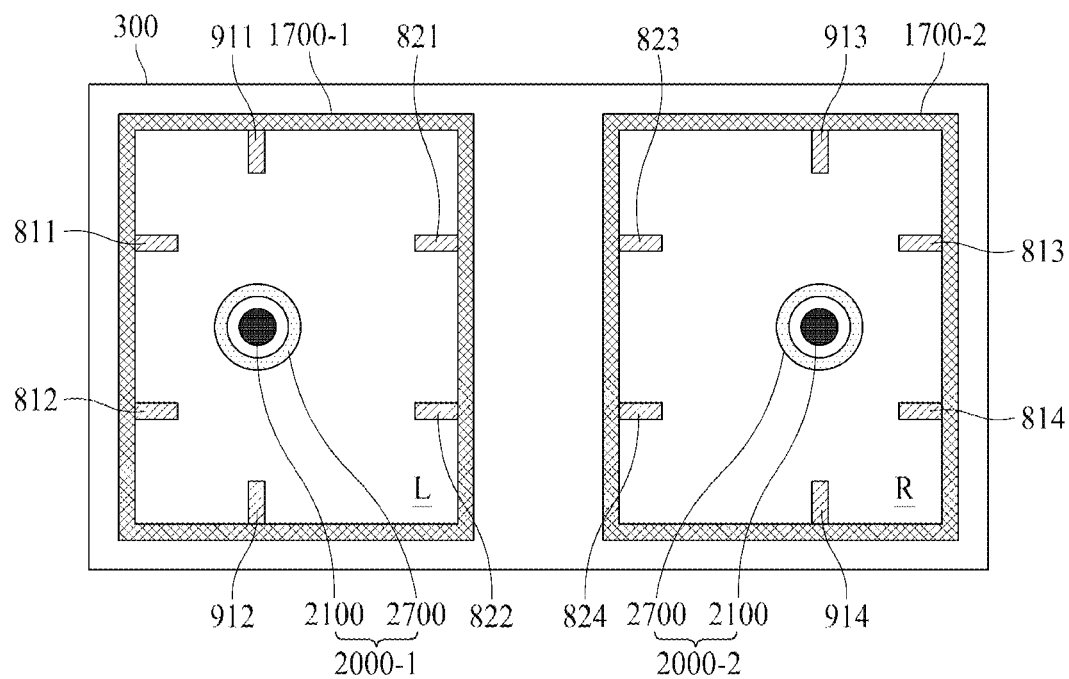

FIGS. 13A to 13C illustrate an embodiment of a vibration generating device and a partition according to another embodiment of the present disclosure.

For explaining FIGS. 13A to 13C, the same explanation as mentioned in FIGS. 12A to 12D may not be duplicated or simplified. For example, the explanation about the vibration generating device or the members may be omitted or simplified.

With reference to FIGS. 13A to 13C, the display panel 100 may comprise a first area L and a second area R. The first area L may be the left area of the rear surface of the display panel 100, and the second area R may be the right area of the rear surface of the display panel 100.

A first partition 1700-1 surrounding the first vibration generating device 2000-1 and a second partition 1700-2 surrounding the second vibration generating device 2000-2 may be provided. The first partition 1700-1 and the second partition 1700-2 may be disposed between the display panel 100 and the supporting member 300. For example, the first partition 1700-1 and the second partition 1700-2 may be disposed between the rear surface of the display panel 100 and the upper surface or front surface of the supporting member 300. For example, the first partition 1700-1 and the second partition 1700-2 may be disposed on the rear surface of the display panel 100. In another example, the first partition 1700-1 and the second partition 1700-2 may be disposed on the upper surface or front surface of the supporting member 300.

A substrate configuring the display panel 300 may use, e.g., a glass substrate. To implement thin display apparatus, the glass substrate may be provided to be thin. For example, by using a glass substrate having a thickness of about 0.7 mm to 0.5 mm, the display apparatus may be more thinly implemented. Because the substrate may be thin, when the partition is provided on the rear surface of the display panel or the upper surface or front surface of the supporting member, a problem may occur in which the display panel is not flat and a step is formed in the display panel, due to the partition, when the display panel is attached to the supporting member. For example, a problem may occur in which the display panel is not flat and a screen is unevenly or roughly seen, due to a shape of the bent portion bounced to or protruded from the screen of the display panel or due to a separated portion of the bent portion, for example, a portion where the two straight-line portions contact each other. Such a phenomenon may be referred to as an "uneven" phenomenon or a "wave" phenomenon of the display panel (hereinafter it is referred to wave phenomenon), but the term is not limited thereto.

To solve the wave phenomenon, the inventors recognized that the first partition 17001 and the second partition 1700-2 should be configured without bent portions. For example, the first partition 1700-1 and the second partition 1700-2 may be arranged as the contour of the display panel. For example, the first partition 1700-1 and the second partition 1700-2 may have a rectangular shape (or tetragonal (e.g., quadrilateral) shape), but embodiments are not limited thereto and may be modified based on a shape of the display panel. When the display panel 100 is curved display panel including non-linear contour or a curve shape, the first partition 1700-1 and the second partition 1700-2 may be disposed along the outer shape of the display panel. The partition may be disposed along a shape of the display panel, and thus, a degree to which the display panel is pulled may be reduced in a process of attaching the supporting member 300 on the display panel, thereby preventing the wave phenomenon. With this configuration, since the peak or dip phenomenon caused by a standing wave may not be controlled, it is preferable that a structure for controlling the peak or dip phenomenon may be configured in the first partition 1700-1 and the second partition 1700-2. This structure may be configured to prevent the wave phenomenon and to easily control the peak or dip phenomenon caused by the standing wave. For example, pads may be provided at least one side of the first partition 1700-1 and the second partition 1700-2.

With reference to FIGS. 13A to 13C, the first partition 1700-1 may include a first side, a second side perpendicular to the first side, and a third side facing and parallel with the first side. A first pad 911 may be provided at the first side of the first partition 1700-1. A second pad 912 may be provided at the third side of the first partition 1700-1 in the first area L. For example, the first pad 911 may be configured to be facing with the second pad 912. The first pad 911 and the second pad 912 may be arranged as toward the first vibration generating device 2000-1. A first member 811 and a second member 812 may be disposed at the second side of the first partition 1700-1. The first pad 911 and the second pad 912 may trap the reflected wave of the progressive wave of the first vibration generating device 2000-1, so that a reduction in sound pressure caused by the standing wave may be decreased. The first pad 911 and the second pad 912 may be referred to as a sound pressure enhancing pad or a vibration enhancing pad, but embodiments are not limited thereto.

For example, the first pad 911 may be disposed symmetrically with the second pad 912 with respect to the first vibration generating device 2000-1. For example, the first pad 911 may be arranged on the same line as the second pad 912 with respect to the first vibration generating device 2000-1. Therefore, the first and second pads 911 and 912 may decrease a reduction in sound pressure caused by a standing wave of the first vibration generating device 2000-1.

For example, the first member 811 and the second member 812 may be disposed symmetrically with the third member 813 and the fourth member 814 with respect to the first vibration generating device 2000-1 or the second vibration generating device 2000-2. For example, the first member 811 and the second member 812 may be arranged on the same line as the third member 813 and the fourth member 814 with respect to the first vibration generating device 2000-1 or the second vibration generating device 2000-2. Therefore, these members may decrease a reduction in sound pressure caused by the standing wave of the first vibration generating device 2000-1 or the second vibration generating device 2000-2.

The first pad 911 and the second pad 912 may be formed of the same material with the first member 811. For example, the first pad 911 and the second pad 912 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the first pad 911 and the second pad 912 may be formed of any one material of polyurethane, polyolefin, and polyethylene, but embodiments are not limited thereto. The first pad 911 and the second pad 912 may have the same shape with the first member 811.

In another example, the first pad 911 and the second pad 912 may be formed of the same material with the first partition 1700-1. For example, the first pad 911 and the second pad 912 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the first pad 911 and the second pad 912 may be formed of any one material of polyurethane, polyolefin, and polyethylene, but embodiments are not limited thereto.

In another example, the first pad 911 may be formed of a material having different material from the first partition 1700-1. For example, the first pad 911 may be formed of a material having a weaker adhesive force than the first partition 1700-1. For example, the first pad 911 may be configured with the single-sided tape. The single-sided tape may be formed of a foam material capable of absorbing an impact upon contact or friction with the display panel 100. When the material of single-sided tape is not a foam material, unwanted abnormal noise may occur due to contact with the display panel 100. For example, the single-sided tape may be formed of any one material of polyurethane, polyolefin, and polyethylene, but embodiments are not limited thereto. When the first pad 911 has different material from the first partition 1700-1, the first pad 911 may be formed of the same material with the first partition 1700-1, but it has different adhesive force from the first partition 1700-1. In another example, the first pad 911 may be formed of different material having different adhesive force than the first partition 1700-1, but embodiments are not limited thereto. The first partition 1700-1 may be formed of a material having strong adhesive force for ensuring the attaching force between the display panel 100 and the supporting member 300. The first pad 911 may be formed of a material having weaker adhesive force than the first partition 1700-1 to reduce the wave phenomenon.

The second pad 912 may be formed of the same material with the first pad 911. When the second pad 912 disposed facing with the first pad 911 is formed of different material from the first pad 911, the wave phenomenon may be occurred due to the different adhesive force as attaching to the display panel 100. In order to reduce the wave phenomenon and the abnormal noises, it is preferable that the second pad 912 is formed of the same material with the first pad 911. For example, the second pad 912 may be configured with the single-sided tape. The single-sided tape may be formed of a foam material capable of absorbing an impact upon contact or friction with the display panel 100. When the material of single-sided tape is not a foam material, unwanted abnormal noise may occur due to contact with the display panel 100. For example, the single-sided tape may be formed of any one material of polyurethane, polyolefin, and polyethylene, but embodiments are not limited thereto.

In another example, the first member 811, the second member 812, the first pad 911 and the second pad 912 may be formed of different material from the first partition 1700-1. For example, the first member 811, the second member 812, the first pad 911 and the second pad 912 may be formed of a material having weaker adhesive force than the first partition 1700-1. For example, the first member 811, the second member 812, the first pad 911 and the second pad 912 may be configured with the single-sided tape. The single-sided tape may be formed of a foam material capable of absorbing an impact upon contact or friction with the display panel 100. When the material of single-sided tape is not a foam material, unwanted abnormal noise may occur due to contact with the display panel 100. For example, the single-sided tape may be formed of any one material of polyurethane, polyolefin, and polyethylene, but embodiments are not limited thereto. When first member 811, the second member 812, the first pad 911 and the second pad 912 has different material from the first partition 1700-1, the first member 811, the second member 812, the first pad 911 and the second pad 912 may be formed of the same material with the first partition 1700-1, but they has different adhesive force from the first partition 1700-1. In another example, the first member 811, the second member 812, the first pad 911 and the second pad 912 may be formed of different material having different adhesive force than the first partition 1700-1, but embodiments are not limited thereto. The first partition 1700-1 may be formed of a material having strong adhesive force for ensuring the attaching force between the display panel 100 and the supporting member 300. The first member 811, the second member 812, the first pad 911 and the second pad 912 may be formed of a material having weaker adhesive force than the first partition 1700-1 to reduce the wave phenomenon.

The second partition 1700-2 may include a first side, a second side perpendicular to the first side, and a third side facing and parallel with the first side. A third pad 913 may be provided at the first side of the second partition 1700-2. A fourth pad 914 may be provided at the third side of the second partition 1700-2 in the second area R. For example, the third pad 913 may be configured to be facing with the fourth pad 914. The third pad 913 and the fourth pad 914 may be arranged as toward the second vibration generating device 2000-2. A third member 813 and a fourth member 814 may be disposed at the second side of the second partition 1700-2. The third pad 913 and the fourth pad 914 may trap the reflected wave of the progressive wave from the second vibration generating device 2000-2, so that a reduction in sound pressure caused by the standing wave may be reduced. The third pad 913 and the fourth pad 914 may be referred to as a sound pressure enhancing pad or a vibration enhancing pad, but embodiments are not limited thereto.

For example, the third pad 913 may be disposed symmetrically with the fourth pad 914 with respect to the second vibration generating device 2000-2. For example, the third pad 913 may be arranged on the same line as the fourth pad 914 with respect to the second vibration generating device 2000-2. Therefore, the third and fourth pads 913 and 914 may decrease a reduction in sound pressure caused by the standing wave of the second vibration generating device 2000-2.

The third pad 913 and the fourth pad 914 may be formed of the same material with the third member 813. For example, the third pad 913 and the fourth pad 914 may be configured with at least one of a double-sided tape, a double-sided foam tape, a double-sided foam pad, a single-sided tape, a single-sided foam tape, a single-sided foam pad, a glue agent and bond agent, but embodiments are not limited thereto. For example, the third pad 913 and the fourth pad 914 may be formed of any one material of polyurethane, polyolefin, and polyethylene, but embodiments are not limited thereto. The third pad 913 and the fourth pad 914 may have the same shape with the third member 813.

In another example, the third pad 913 and the fourth pad 914 may be formed of the same material with the second partition 1700-2. For example, the third pad 913 and the fourth pad 914 may be configured with at least one of a double-sided tape, a double-sided foam tape, a double-sided foam pad, a single-sided tape, a single-sided foam tape, a single-sided foam pad, a glue agent and bond agent, but embodiments are not limited thereto. For example, the third pad 913 and the fourth pad 914 may be formed of any one material of polyurethane, polyolefin, and polyethylene, but embodiments are not limited thereto.

In another example, the third pad 913 may be formed of a material having different material from the second partition 1700-2. For example, the third pad 913 may be formed of a material having weaker adhesive force than the second partition 1700-2. For example, the third pad 913 may be configured with the single-sided tape. The single-sided tape may be formed of a foam material capable of absorbing an impact upon contact or friction with the display panel 100. When the material of single-sided tape is not a foam material, unwanted abnormal noise may appear due to contact with the display panel 100. For example, the single-sided tape may be formed of any one material of polyurethane, polyolefin and polyethylene, but embodiments are not limited thereto. When the third pad 913 has different material from the second partition 1700-2, the third pad 913 may be formed of the same material with the second partition 1700-2, but it has different adhesive force from the second partition 1700-2. In another example, the third pad 913 may be formed of different material having different adhesive force than the second partition 1700-2, but embodiments are not limited thereto. The second partition 1700-2 may be formed of a material having strong adhesive force for ensuring the attaching force between the display panel 100 and the supporting member 300. The third pad 913 may be formed of a material having weaker adhesive force than the second partition 1700-2 to reduce the wave phenomenon.

The fourth pad 914 may be formed of the same material with the third pad 913. When the fourth pad 914 disposed facing with the third pad 913 is formed of different material from the third pad 913, the wave phenomenon may be occurred due to the different adhesive force as attaching to the display panel 100. In order to reduce the wave phenomenon and the abnormal noises, it is preferable that the fourth pad 914 is formed of the same material with the third pad 913. For example, the fourth pad 914 may be configured with the single-sided tape. The single-sided tape may be formed of a foam material capable of absorbing an impact upon contact or friction with the display panel 100. When the material of single-sided tape is not a foam material, unwanted abnormal noise may appear due to contact with the display panel 100. For example, the single-sided tape may be formed of any one material of polyurethane, polyolefin, and polyethylene, but embodiments are not limited thereto.

In another example, the third member 813, the fourth member 814, the third pad 913 and the fourth pad 914 may be formed of different material from the second partition 1700-2. For example, the third ember 813, the fourth member 814, the third pad 913 and the fourth pad 914 may be formed of a material having weaker adhesive force than the second partition 1700-2. For example, the third member 813, the fourth member 814, the third pad 913 and the fourth pad 914 may be configured with the single-sided tape. The single-sided tape may be formed of a foam material capable of absorbing an impact upon contact or friction with the display panel 100. When the material of single-sided tape is not a foam material, unwanted abnormal noise may appear due to contact with the display panel 100. For example, the single-sided tape may be formed of any one material of polyurethane, polyolefin, and polyethylene, but embodiments are not limited thereto. When third member 813, the fourth member 814, the third pad 913 and the fourth pad 914 has different material from the second partition 1700-2, the third 1 member 813, the fourth member 814, the third pad 913 and the fourth pad 914 may be formed of the same material with the second partition 1700-2, but they has different adhesive force from the second partition 1700-2. In another example, the third member 813, the fourth member 814, the third pad 913 and the fourth pad 914 may be formed of different material having different adhesive force than the second partition 1700-2, but embodiments are not limited thereto. The second partition 1700-2 may be formed of a material having strong adhesive force for ensuring the attaching force between the display panel 100 and the supporting member 300. The third member 813, the fourth member 814, the third pad 913 and the fourth pad 914 may be formed of a material having weaker adhesive force than the second partition 1700-2 to reduce the wave phenomenon.

With reference to FIG. 13B, a third partition 1700' may be further disposed at an edge or periphery of the supporting member 300. The third partition 1700' may be disposed on the rear surface of the display panel 100 or on the upper surface or front surface of the supporting member 300. The third partition 1700' may be disposed at an edge or periphery on the rear surface of the display panel 100. Otherwise, the third partition 1700' may be disposed at an edge or periphery of the supporting member 300. The third partition 1700' may be disposed at an edge or periphery on the upper surface or front surface of the supporting member 300. The third partition 1700' may configure the air gap or the space for generating or propagating the sounds. The third partition 1700' may be an adhesive member for attaching the display panel 100 to the supporting member 300. The third partition 1700' may be omitted. The third partition 1700' may be formed of the same material with the first partition 1700-1 and the second partition 1700-2, but embodiments are not limited thereto. For example, the third partition 1700' may be formed of at least one of a double-sided tape, a double-sided foam tape, a double-sided foam pad, a single-sided tape, a single-sided foam tape, a single-sided foam pad, a glue agent, and bond agent, but embodiments are not limited thereto. For example, the third partition 1700' may be formed of any one material of polyurethane, polyolefin, and polyethylene, but embodiments are not limited thereto. The configuration and the explanation of the third partition 1700' may be also applied to FIG. 13C.

With reference to FIG. 13C, at least one side of the first partition 1700-1 may include at least one pad. The same explanation in FIG. 13A may not be duplicated. For example, the first pad 911 may be disposed at the first side of the first partition 1700-1, and the second pad 912 may be disposed at the third side facing with the first side of the first partition 1700-1. The first member 811 and the second member 812 may be provided at the second side of the first partition 1700-1. The fifth member 821 and the sixth member 822 may be disposed at the fourth side facing with the second side of the first partition 1700-1. The second side where the first member 811 and the second member 812 is facing with the fourth side where the fifth member 821 and the sixth member 822. For example, the fifth member 821 and the sixth member 822 may be further disposed the side which is facing with the fifth member 821 and the sixth additional member 822. The fifth member 821 and the sixth member 822 may be arranged as toward the first vibration generating device 2000-1. Because the fifth member 821 and the sixth member 822, a reduction in the sound pressure caused by the standing wave may be further reduced.

For example, the first member 811 and the second member 812 may be disposed symmetrically with the fifth member 821 and the sixth member 822 with respect to the first vibration generating device 2000-1. The first member 811 and the second member 812 may be disposed on the same line as the fifth member 821 and the sixth member 822 with respect to the first vibration generating device 2000-1. Therefore, these members 821 and 822 may further decrease a reduction in sound pressure caused by the standing wave of the first vibration generating device 2000-1.

For example, the first pad 911 may be disposed symmetrically with the second pad 912 with respect to the first vibration generating device 2000-1. For example, the first pad 911 may be arrange on the same line as the second pad 912 with respect to the first vibration generating device 2000-1. Therefore, these pads 911 and 912 may further decrease a reduction in sound pressure caused by the standing wave of the first vibration generating device 2000-1.

The fifth member 821 and the sixth member 822 may be formed of the same material with the first member 811. For example, the fifth member 821 and the sixth member 822 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the fifth member 821 and the sixth member 822 may be formed of any one material of polyurethane, polyolefin, and polyethylene, but embodiments are not limited thereto. The shape and the size of the fifth member 821 and the sixth member 822 may be same with those of the first to fourth members 811, 812, 813, and 814.

The fifth member 821 and the sixth member 822 may be formed of the same material with the first pad 911. For example, the fifth member 821 and the sixth member 822 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the fifth member 821 and the sixth member 822 may be formed of any one material of polyurethane, polyolefin, and polyethylene, but embodiments are not limited thereto.

In another example, the fifth member 821 and the sixth member 822 may be formed of a material having different material from the first partition 1700-1. For example, the fifth member 821 and the sixth member 822 may be formed of a material having weaker adhesive force than the first partition 1700-1. For example, the fifth member 821 and the sixth member 822 may be configured with the single-sided tape. The single-sided tape may be formed of a foam material capable of absorbing an impact upon contact or friction with the display panel 100. When the material of single-sided tape is not a foam material, unwanted abnormal noise may occur due to contact with the display panel 100. For example, the single-sided tape may be formed of any one material of polyurethane, polyolefin, and polyethylene, but embodiments are not limited thereto. When the fifth member 821 and the sixth member 822 has different material from the first partition 1700-1, the fifth member 821 and the sixth member 822 may be formed of the same material with the first partition 1700-1, but they may have different adhesive force from the first partition 1700-1. In another example, the fifth member 821 and the sixth member 822 may be formed of different material having different adhesive force than the first partition 1700-1, but embodiments are not limited thereto. The first partition 1700-1 may be formed of a material having strong adhesive force for ensuring the attaching force between the display panel 100 and the supporting member 300. The fifth member 821 and the sixth member 822 may be formed of a material having weaker adhesive force than the first partition 1700-1 to reduce the wave phenomenon.

In another example, the first member 811, the second member 812, the fifth member 821, the sixth member 822, the first pad 911 and the second pad 912 may be formed of different material from the first partition 1700-1. For example, the first member 811, the second member 812, the fifth member 821, the sixth member 822, the first pad 911 and the second pad 912 may be formed of a material having weaker adhesive force than the first partition 1700-1. For example, the first member 811, the second member 812, the fifth member 821, the sixth member 822, the first pad 911 and the second pad 912 may be configured with the single-sided tape. The single-sided tape may be formed of a foam material capable of absorbing an impact upon contact or friction with the display panel 100. When the material of single-sided tape is not a foam material, unwanted abnormal noise may occur due to contact with the display panel 100. For example, the single-sided tape may be formed of any one material of polyurethane, polyolefin, and polyethylene, but embodiments are not limited thereto. When first member 811, the second member 812, the fifth member 821, the sixth member 822, the first pad 911 and the second pad 912 has different material from the first partition 1700-1, the first member 811, the second member 812, the fifth member 821, the sixth member 822, the first pad 911 and the second pad 912 may be formed of the same material with the first partition 1700-1, but they has different adhesive force from the first partition 1700-1. In another example, the first member 811, the second member 812, the fifth member 821, the sixth member 822, the first pad 911 and the second pad 912 may be formed of different material having different adhesive force than the first partition 1700-1, but embodiments are not limited thereto. The first partition 1700-1 may be formed of a material having strong adhesive force for ensuring the attaching force between the display panel 100 and the supporting member 300. The first member 811, the second member 812, the fifth member 821, the sixth member 822, the first pad 911 and the second pad 912 may be formed of a material having weaker adhesive force than the first partition 1700-1 to reduce the wave phenomenon.

With reference to FIG. 13C, at least one side of the second partition 1700-2 may have at least one pad. The same explanation mentioned in FIG. 13A may not be duplicated. For example, the third pad 913 may be disposed at the first side of the second partition 1700-2, and the fourth pad 914 may be disposed at the third side facing with the first side of the second partition 1700-2. The third member 813 and the fourth member 814 may be provided at the second side of the second partition 1700-2. The seventh member 823 and the eighth member 824 may be disposed at the fourth side facing with the second side of the second partition 1700-2. The second side where the third member 813 and the fourth member 814 is facing with the fourth side where the seventh member 823 and the eighth member 824. For example, the seventh member 823 and the eighth member 824 may be further disposed the side which is facing with the second side of the second partition 1700-2. The seventh member 823 and the eighth member 824 may be arranged as toward the second vibration generating device 2000-2. With the seventh member 823 and the eighth member 824, a reduction in sound pressure caused by the standing wave may be further reduced.

For example, the third member 813 and the fourth member 814 may be disposed symmetrically with the seventh member 823 and the eighth member 824 with respect to the second vibration generating device 2000-2. The third member 813 and the fourth member 814 may be disposed on the same line as the seventh member 823 and the eighth member 824 with respect to the second vibration generating device 2000-2. Therefore, these members 823 and 824 may further decrease a reduction in sound pressure caused by the standing wave of the second vibration generating device 2000-2.

For example, the third pad 913 may be disposed symmetrically with the fourth pad 914 with respect to the second vibration generating device 2000-2. For example, the third pad 913 may be arrange on the same line as the fourth pad 914 with respect to the second vibration generating device 2000-2. Therefore, these pads 913 and 914 may further decrease a reduction in sound pressure caused by the standing wave of the second vibration generating device 2000-2.

The seventh member 823 and the eighth member 824 may be formed of the same material with the third member 813. For example, the seventh member 823 and the eighth member 824 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the seventh member 823 and the eighth member 824 may be formed of any one material of polyurethane, polyolefin, and polyethylene, but embodiments are not limited thereto. The shape and the size of the seventh member 823 and the eighth member 824 may be same with those of the first to fourth members 811, 812, 813 and 814.

The seventh member 823 and the eighth member 824 may be formed of the same material with the third pad 913. For example, the seventh member 823 and the eighth member 824 may be configured with at least one of a double-sided tape, a double-sided foam tape, a double-sided foam pad, a single-sided tape, a single-sided foam tape, a single-sided foam pad, a glue agent, and bond agent, but embodiments are not limited thereto. For example, the seventh member 823 and the eighth member 824 may be formed of any one material of polyurethane, polyolefin, and polyethylene, but embodiments are not limited thereto.

In another example, the seventh member 823 and the eighth member 824 may be formed of a material having different material from the second partition 1700-2. For example, the seventh member 823 and the eighth member 824 may be formed of a material having weaker adhesive force than the second partition 1700-2. For example, the seventh member 823 and the eighth member 824 may be configured with the single-sided tape. The single-sided tape may be formed of a foam material capable of absorbing an impact upon contact or friction with the display panel 100. When the material of single-sided tape is not a foam material, unwanted abnormal noise may occur due to contact with the display panel 100. For example, the single-sided tape may be formed of any one material of polyurethane, polyolefin, and polyethylene, but embodiments are not limited thereto. When the seventh member 823 and the eighth member 824 has different material from the second partition 1700-2, the seventh member 823 and the eighth member 824 may be formed of the same material with the second partition 1700-2, but they may have different adhesive force from the second partition 1700-2. In another example, the seventh member 823 and the eighth member 824 may be formed of different material having different adhesive force than the second partition 1700-2, but embodiments are not limited thereto. The second partition 1700-2 may be formed of a material having strong adhesive force for ensuring the attaching force between the display panel 100 and the supporting member 300. The seventh member 823 and the eighth member 824 may be formed of a material having weaker adhesive force than the second partition 1700-2 to reduce the wave phenomenon.

In another example, the third member 813, the fifth member 814, the seventh member 823, the eighth member 824, the third pad 913 and the fourth pad 914 may be formed of different material from the second partition 1700-2. For example, the third member 813, the fifth member 814, the seventh member 823, the eighth member 824, the third pad 913 and the fourth pad 914 may be formed of a material having weaker adhesive force than the second partition 1700-1. For example, the third member 813, the fourth member 814, the seventh member 823, the eighth member 824, the third pad 913 and the fourth pad 914 may be configured with the single-sided tape. The single-sided tape may be formed of a foam material capable of absorbing an impact upon contact or friction with the display panel 100. When the material of single-sided tape is not a foam material, unwanted abnormal noise may occur due to contact with the display panel 100. For example, the single-sided tape may be formed of any one material of polyurethane, polyolefin, and polyethylene, but embodiments are not limited thereto. When third member 813, the fourth member 814, the seventh member 823, the eighth member 824, the third pad 913 and the fourth pad 914 has different material from the second partition 1700-2, the third member 813, the fourth member 814, the seventh member 823, the eighth member 824, the third pad 913 and the fourth pad 914 may be formed of the same material with the second partition 1700-2, but they has different adhesive force from the second partition 1700-2. In another example, the third member 813, the fourth member 814, the seventh member 823, the eighth member 824, the third pad 913 and the fourth pad 914 may be formed of different material having different adhesive force than the second partition 1700-2, but embodiments are not limited thereto. The second partition 1700-2 may be formed of a material having strong adhesive force for ensuring the attaching force between the display panel 100 and the supporting member 300. The third member 813, the fourth member 814, the seventh member 823, the eighth member 824, the third pad 913 and the fourth pad 914 may be formed of a material having weaker adhesive force than the second partition 1700-2 to reduce the wave phenomenon.

In FIGS. 12A to 12D and 13A to 13C show that the vibration generating device 2000 is not disposed at the center of the left area, the first area L of the display panel 100, or the center of the right area, the second area R of the display panel 100, but disposed as being shifted toward to left side or right side. However, embodiments are not limited thereto, the vibration generating device 200 may be disposed at the center of the left area, the first area L of the display panel 100, or the center of the right area, the second area R of the display panel 100. For example, in the case that the vibration generating device 200 may be disposed at the center of the first area L or the center of the second area R, as the first to fourth bent portions 711, 712, 713, and 714 are arranged toward center of the vibration generating device 2000, the first to fourth bent portions 711, 712, 713, and 714 may be disposed at the center of the first area L and the second area R. For example, in the case that the vibration generating device 200 may be disposed at the center of the left area or the center of the right area, as the first to fourth bent portions 711, 712, 713, and 714 are arranged toward center of the vibration generating device 2000, the first to fourth bent portions 711, 712, 713, and 714 may be disposed at the centers of the first side and the third side of the first partition 1700-1 or at the centers of the first side and the third side of the second partition 1700-2. For example, in the case that the vibration generating device 200 may be disposed at the center of the first area L or the center of the second area R, as the first to fourth pads 911, 912, 913 and 914 are arranged toward center of the vibration generating device 2000, the first to fourth pads 911, 912, 913 and 914 may be disposed at the center of the first area L and the second area R. For example, in the case that the vibration generating device 200 may be disposed at the center of the left area or the center of the right area, as the first to fourth pads 911, 912, 913 and 914 are arranged toward center of the vibration generating device 2000, the first to fourth pads 911, 912, 913 and 914 may be disposed at the centers of the first side and the third side of the first partition 1700-1 or at the centers of the first side and the third side of the second partition 1700-2. In another example, the vibration generating device 2000 may be disposed asymmetrically in the first area L and the second area R of the display panel 100. In the case that the vibration generating device 2000 is disposed at the left shifted side from the center of the first area L or at the right shifted side from the center of the second area R of the display panel 100, the stereo sound characteristics may be further improved.

The vibration generating device or the sound generating device according to the present disclosure may be applied to the system in which the vibration generating device or the sound generating device is embedded into the display apparatus. The display apparatus according to the present disclosure may be applied to any one of the mobile device, the videophone, the smart watch, the watch phone, the wearable apparatus, the foldable apparatus, the rollable apparatus, the bendable apparatus, the flexible apparatus, the curved apparatus, the electric notebook, the electric book, PMP (portable multimedia player), PDA (personal digital assistant), MP3 player, the mobile medical device, the desktop personal computer, the netbook computer, the workstation, the navigation system, the automobile navigation, the automobile display device, the theater device, the theater display device, the television set, the wallpaper device, the signage device, the game device, the notebook computer, monitors, camera, camcorder and other electric appliances. The vibration generating device or the sound generating device may be applied to the organic luminescent lighting device or the inorganic luminescent lighting device. In the case that the vibration generating device or the sound generating device is applied to the lighting devices, the lighting device may include the function of speaker.

A display apparatus according to the present disclosure will be described as below.

A display apparatus according to an embodiment of the present disclosure comprises: a display panel configured to display an image; and a vibration generating device configured to vibrate the display panel to generate sound, wherein the vibration generating device includes a first sound generating device at a rear surface of the display panel, and outputting a first sound; and a second sound generating device around the first sound generating device, and outputting a second sound.

According to some embodiments of the present disclosure, the display apparatus may further comprise a supporting member at the rear surface of the display panel, and configured to support the display panel; and a frame body between the supporting member and the vibration generating device.

According to some embodiments of the present disclosure, the supporting member may include a hole in which the vibration generating device is accommodated.

According to some embodiments of the present disclosure, the first sound generating device and the second sound generating device may be disposed on the frame body.

According to some embodiments of the present disclosure, the first sound may include a high-pitched sound band, and the second sound includes a low-pitched sound band.

According to some embodiments of the present disclosure, the first sound generating device may include a voice coil sound generating device and the second sound generating device includes a magnetic circuit sound generating device.

According to some embodiments of the present disclosure, the second sound generating device may be disposed as surrounding the first sound generating device.

According to some embodiments of the present disclosure, the first sound generating device may include a yoke on a frame body; a magnet on the yoke; a bobbin around the magnet; a coil around the bobbin; and a damper between the bobbin and the yoke.

According to some embodiments of the present disclosure, the second sound generating device may include a bobbin on a frame body; a coil around the bobbin; a yoke on the rear surface of the display panel; a magnet at one portion of the yoke; and a damper at another portion of the yoke.

According to some embodiments of the present disclosure, the first sound generating device may be disposed as surrounding the second sound generating device.

According to some embodiments of the present disclosure, the first sound generating device may include a yoke on a frame body; a magnet on the yoke; a bobbin around the magnet; a coil around the bobbin; and a damper between the bobbin and the yoke.

According to some embodiments of the present disclosure, the magnet may include a first magnet and a center pole separated from each other on the yoke, the bobbin being disposed around the center pole of the magnet.

According to some embodiments of the present disclosure, the display apparatus may further include bobbin ring on the bobbin and attached to the display panel by an adhesive member.

According to some embodiments of the present disclosure, the second sound generating device may include a bobbin on a frame body; a coil around the bobbin; a yoke on the rear surface of the display panel; a magnet at one portion of the yoke; and a damper at another portion of the yoke.

According to some embodiments of the present disclosure, the display apparatus may further comprise a first heat dissipation member between the display panel and the vibration generating device.

According to some embodiments of the present disclosure, the display apparatus may further comprise a supporting member at the rear surface of the display panel, and configured to support the display panel; a frame body between the supporting member and the vibration generating device; and a second heat dissipation member between the supporting member and the frame body.

According to some embodiments of the present disclosure, the display apparatus may further include a third heat dissipation member at the rear surface of the vibration generating device.

A display apparatus according to an embodiment of the present disclosure comprises: a display panel including a first area and a second area, and configured to display an image; a first vibration generating device at the first area at a rear surface of the display panel; a second vibration generating device at the second area at the rear surface of the display panel; a first partition surrounding the first vibration generating device; and a second partition surrounding the second vibration generating device, wherein each of the first vibration generating device and the second vibration generating device includes: a first sound generating device outputting a first sound; and a second sound generating device disposed near the first sound generating device, and outputting a second sound different from the first sound.

According to some embodiments of the present disclosure, the first sound may include a high-pitched sound band, and the second sound may include a low-pitched sound band.

According to some embodiments of the present disclosure, the first sound generating device may include a voice coil sound generating device, and the second sound generating device may include a magnetic circuit sound generating device.

According to some embodiments of the present disclosure, the first sound generating device may be disposed as surrounding the second sound generating device.

According to some embodiments of the present disclosure, the second sound generating device may be disposed as surrounding the first sound generating device.

According to some embodiments of the present disclosure, the first partition may include a first side; a second side perpendicular to the first side; a third side facing with the first side; a first bent portion at the first side; and a second bent portion at the third side.

According to some embodiments of the present disclosure, the first partition may include a first side; a second side perpendicular to the first side; a third side facing with the first side; a first bent portion at the first side; a second bent portion at the third side; and at least one member at the second side.

According to some embodiments of the present disclosure, the first partition may include a first side; a second side perpendicular to the first side; a third side facing with and parallel to the first side; a fourth side facing with the second side; a first bent portion at the first side; a second bent portion at the third side; at least one first member at the second side; and at least one second member at the fourth side.

According to some embodiments of the present disclosure, the second partition may include a first side; a second side perpendicular to the first side; a third side facing with the first side; a third bent portion at the first side; and a fourth bent portion at the third side.

According to some embodiments of the present disclosure, the second partition may include a first side; a second side perpendicular to the first side; a third side facing with the first side; a third bent portion at the first side; a fourth bent portion at the third side; and at least one member at the second side.

According to some embodiments of the present disclosure, the second partition may include a first side; a second side perpendicular to the first side; a third side facing with the first side; a fourth side facing with the second side; a third bent portion at the first side; a fourth bent portion at the third side; at least one third member at the second side; and at least one fourth member at the fourth side.

According to some embodiments of the present disclosure, the first partition may include a first side; a second side perpendicular to the first side; a third side facing with the first side; a first pad at the first side; and a second pad at the third side.

According to some embodiments of the present disclosure, the first partition may include a first side; a second side perpendicular to the first side; a third side facing with the first side; a first pad at the first side; a second pad at the third side; and at least one member at the second side.

According to some embodiments of the present disclosure, the first partition may include a first side; a second side perpendicular to the first side; a third side facing with the first side; a fourth side facing with the second side; a first pad at the first side; a second pad at the third side; at least one first member at the second side; and at least one second member at the fourth side.

According to some embodiments of the present disclosure, the second partition may include a first side; a second side perpendicular to the first side; a third side facing with the first side; a third pad at the first side; and a fourth pad at the third side.

According to some embodiments of the present disclosure, the second partition may include a first side; a second side perpendicular to the first side; a third side facing with the first side; a third pad at the first side; a fourth pad at the third side; and at least one member at the second side.

According to some embodiments of the present disclosure, the second partition may include a first side; a second side perpendicular to the first side; a third side facing with the first side; a fourth side facing with the second side; a third pad at the first side; a fourth pad d at the third side; at least one third member at the second side; and at least one fourth member at the fourth side.

According to some embodiments of the present disclosure, the first sound generating device may include yoke on a frame body, a magnet on the yoke. a center pole on the magnet, a bobbin around the magnet, a coil around the bobbin, and a damper between the bobbin and the yoke.

According to some embodiments of the present disclosure, the second sound generating device may include a bobbin on a frame body, a coil around the bobbin, a yoke on the rear surface of the display panel, a magnet on the yoke, a center pole on the magnet, and a damper between the yoke and the frame body.

According to some embodiments of the present disclosure, the display apparatus may further include a supporting member at the rear surface of the display panel, a frame body between the supporting member and the first and second vibration generating devices, and a third partition at an edge or periphery of the supporting member.

It will be apparent to those skilled in the art that various modifications and variations may be made in the display apparatus of the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display apparatus, comprising:
    a display panel configured to display an image;
    a supporting member at a rear surface of the display panel and supporting the display panel;
    a vibration generating device between the display panel and the supporting member and configured to vibrate the display panel to generate sound; and
    a frame body between the supporting member and the vibration generating device, a rear surface of the frame body facing a front surface of the supporting member,
    wherein the vibration generating device includes:
        a first sound generating device at the rear surface of the display panel and configured to output a first sound; and
        a second sound generating device around the first sound generating device, the second sound generating device being configured to output a second sound, and
    wherein one of the first sound generating device and the second sound generating device includes a bobbin attached to the frame body.

2. The display apparatus of claim 1, wherein the supporting member includes a hole in which the vibration generating device is accommodated.

3. The display apparatus of claim 1, wherein the first sound generating device and the second sound generating device are disposed on the frame body.

4. The display apparatus of claim 1, wherein the first sound includes a high-pitched sound band, and the second sound includes a low-pitched sound band.

5. The display apparatus of claim 1, wherein the first sound generating device includes a voice coil sound generating device, and the second sound generating device includes a magnetic circuit sound generating device.

6. The display apparatus of claim 1, wherein the second sound generating device is disposed as surrounding the first sound generating device.

7. The display apparatus of claim 5, wherein:
    the second sound generating device includes the bobbin, and
    the first sound generating device includes:
        a yoke on the frame body;
        a magnet on the yoke;
        a second bobbin around the magnet;
        a coil around the second bobbin; and
        a damper between the second bobbin and the yoke.

8. The display apparatus of claim 6, wherein the second sound generating device includes:
    the bobbin on the frame body;
    a coil around the bobbin;
    a yoke on the rear surface of the display panel;
    a magnet at one portion of the yoke; and
    a damper at another portion of the yoke.

9. The display apparatus of claim 1, wherein the first sound generating device is disposed as surrounding the second sound generating device.

10. The display apparatus of claim 9, wherein the second sound generating device includes the bobbin, and
    the first sound generating device includes:
        a yoke on a frame body;
        a magnet on the yoke;
        a second bobbin around the magnet;
        a coil around the second bobbin; and
        a damper between the second bobbin and the yoke.

11. The display apparatus of claim 10, wherein the magnet includes a first magnet and a center pole separated from each other on the yoke, the second bobbin being disposed around the center pole of the magnet.

12. The display apparatus of claim 10, further comprising:
    a bobbin ring disposed on the second bobbin and attached to the display panel by an adhesive member.

13. The display apparatus of claim 9, wherein the second sound generating device includes:
    the bobbin on a frame body;
    a coil around the bobbin;
    a yoke on the rear surface of the display panel; a magnet at one portion of the yoke; and a damper at another portion of the yoke.

14. The display apparatus of claim 1, further comprising:
    a first heat dissipation member between the display panel and the vibration generating device.

15. The display apparatus of claim 1, further comprising:
    a second heat dissipation member between the supporting member and the frame body.

16. The display apparatus of claim 15, further comprising:
    a third heat dissipation member at the rear surface of the vibration generating device.

17. The display apparatus of claim 1, further comprising:
    a connection member penetrating through the supporting member and connected to the frame body, the connection member overlapping with the first sound generating device or the second sound generating device.

18. The display apparatus of claim 1, wherein the bobbin is attached to the frame body without being adhered to the display panel.

19. The display apparatus of claim 1, wherein the one of the first sound generating device and the second sound generating device further includes a yoke attached to the rear surface of the display panel.

20. The display apparatus of claim 1, wherein the other of the first sound generating device and the second sound generating device includes another bobbin attached to the display panel.

* * * * *